US012765392B2

(12) United States Patent
Kang et al.

(10) Patent No.: US 12,765,392 B2
(45) Date of Patent: Oct. 13, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Junghoon Kang, Suwon-si (KR); Unbyoung Kang, Suwon-si (KR); Jinsu Kim, Suwon-si (KR); Seungwan Shin, Suwon-si (KR); Byoungwook Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 372 days.

(21) Appl. No.: 18/515,797

(22) Filed: Nov. 21, 2023

(65) Prior Publication Data

US 2024/0213174 A1 Jun. 27, 2024

(30) Foreign Application Priority Data

Dec. 22, 2022 (KR) ........................ 10-2022-0181317
Jan. 10, 2023 (KR) ........................ 10-2023-0003377

(51) Int. Cl.

| | |
|---|---|
| ***H10W 46/00*** | (2026.01) |
| ***H10W 74/10*** | (2026.01) |
| ***H10W 90/00*** | (2026.01) |
| *H10W 70/60* | (2026.01) |
| *H10W 90/24* | (2026.01) |

(52) U.S. Cl.

CPC .......... *H10W 46/00* (2026.01); *H10W 74/117* (2026.01); *H10W 90/00* (2026.01); *H10W 90/701* (2026.01); *H10W 46/401* (2026.01); *H10W 70/60* (2026.01); *H10W 90/24* (2026.01);

(Continued)

(58) Field of Classification Search

CPC ... H10W 46/00; H10W 90/00; H10W 90/701; H10W 46/401; H10W 70/60; H10W 70/09; H10W 70/614; H10W 70/685; H10W 74/019; H10P 72/74

See application file for complete search history.

(56) References Cited

U.S. PATENT DOCUMENTS 8,373,069 B2 2/2013 Kariya et al.
9,343,434 B2 5/2016 Chen (Continued)

*Primary Examiner* — Bac H Au

(74) *Attorney, Agent, or Firm* — Wolf, Greenfield & Sacks, P.C.

(57) ABSTRACT

A semiconductor package includes a lower redistribution wiring layer having a first region and a second region adjacent the first region and including first redistribution wirings; a semiconductor chip on the first region of the lower redistribution wiring layer and electrically connected to the first redistribution wirings; a sealing member on a side surface of the semiconductor chip and on the lower redistribution wiring layer; a plurality of vertical conductive structures penetrating the sealing member on the second region of the lower redistribution wiring layer and electrically connected to the first redistribution wirings; a marking pattern on the semiconductor chip; seed layer pads on respective end portions of the vertical conductive structures that are exposed by the sealing member at an upper surface thereof; and an upper redistribution wiring layer on the sealing member and the marking pattern and including second redistribution wirings.

20 Claims, 26 Drawing Sheets

11

(52) U.S. Cl.
CPC ........ *H10W 90/724* (2026.01); *H10W 90/752* (2026.01); *H10W 90/754* (2026.01)

(56) References Cited

U.S. PATENT DOCUMENTS

| | | | | |
|---|---|---|---|---|
| 9,589,900 | B2 | 3/2017 | Su et al. | |
| 9,721,933 | B2 | 8/2017 | Chen | |
| 9,728,508 | B2 | 8/2017 | Lin et al. | |
| 11,107,772 | B2 | 8/2021 | Chiang et al. | |
| 11,189,567 | B2 | 11/2021 | Han et al. | |
| 11,362,009 | B2 | 6/2022 | Lin et al. | |
| 2015/0243633 | A1* | 8/2015 | Chen | H01L 25/105 257/774 |
| 2015/0270247 | A1* | 9/2015 | Chen | H01L 25/0655 257/737 |
| 2015/0348904 | A1* | 12/2015 | Huang | H10W 46/00 438/666 |
| 2019/0084088 | A1 | 3/2019 | Takei et al. | |
| 2019/0148262 | A1* | 5/2019 | Pei | H01L 23/3677 257/713 |
| 2019/0237382 | A1* | 8/2019 | Kim | H10W 40/22 |
| 2020/0273806 | A1* | 8/2020 | Chiang | B23K 26/402 |
| 2023/0369263 | A1* | 11/2023 | Chuang | H10W 74/117 |

* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application Nos. 10-2022-0181317, filed on Dec. 22, 2022 and 10-2023-0003377, filed on Jan. 10, 2023 in the Korean Intellectual Property Office (KIPO), the contents of which are herein incorporated by reference in their entirety.

FIELD

Example embodiments relate to a semiconductor package and a method of manufacturing the semiconductor package. More particularly, example embodiments relate to a fan-out package and a method of manufacturing the same.

BACKGROUND

In manufacturing a fan-out package, a sealing member may be formed on a lower redistribution wiring layer to cover a semiconductor chip, copper posts may be formed to penetrate the sealing member, and a backside redistribution wiring layer may be formed on the sealing member. Then, a marking pattern may be formed by performing a laser marking process on an outermost insulating layer of the backside redistribution wiring layer. However, since the laser marking process may use a laser with a wavelength in the green wavelength range (e.g., 532 nm), and since the reflectance of the material of the insulating layer in the green laser wavelength range may be high, laser ablation may be difficult, thereby making it difficult to secure marking visibility.

SUMMARY

Example embodiments provide a semiconductor package a semiconductor package that has improved the visibility of a marking pattern and can improve the efficiency of manufacturing processes.

Example embodiments provide a method of manufacturing the semiconductor package.

According to example embodiments, a semiconductor package includes a lower redistribution wiring layer having a first region and a second region adjacent the first region, the lower redistribution wiring layer including first redistribution wirings; a semiconductor chip on the first region of the lower redistribution wiring layer and electrically connected to the first redistribution wirings; a sealing member on a side surface of the semiconductor chip and on the lower redistribution wiring layer; a plurality of vertical conductive structures penetrating the sealing member on the second region of the lower redistribution wiring layer and electrically connected to the first redistribution wirings; a marking pattern on the semiconductor chip; seed layer pads on respective end portions of the vertical conductive structures that are exposed by the sealing member at an upper surface thereof; and an upper redistribution wiring layer on the sealing member and the marking pattern, the upper redistribution wiring layer including second redistribution wirings electrically connected to the plurality of vertical conductive structures.

According to example embodiments, a semiconductor package includes a lower redistribution wiring layer including first redistribution wirings; a semiconductor chip on the lower redistribution wiring layer, wherein a first surface of the semiconductor chip comprising chip pads faces the lower redistribution wiring layer; a sealing member on the semiconductor chip and on the lower redistribution wiring layer, wherein the sealing member exposes a second surface of the semiconductor chip opposite to the first surface; a plurality of vertical conductive structures penetrating the sealing member and electrically connected to the first redistribution wirings; a marking pattern on the second surface of the semiconductor chip; and an upper redistribution wiring layer on the sealing member and the marking pattern, the upper redistribution wiring layer including second redistribution wirings electrically connected to the plurality of vertical conductive structures. An upper surface of the marking pattern is coplanar with an upper surface of the sealing member.

According to example embodiments, a semiconductor package includes a lower redistribution wiring layer having a first region and a second region adjacent the first region, the lower redistribution wiring layer including first redistribution wirings; a semiconductor chip on the first region of the lower redistribution wiring layer, wherein a first surface of the semiconductor chip comprising chip pads faces the lower redistribution wiring layer; a sealing member on the semiconductor chip and on the lower redistribution wiring layer, wherein the sealing member exposes a second surface of the semiconductor chip opposite to the first surface; a plurality of vertical conductive structures penetrating the sealing member on the second region of the lower redistribution wiring layer and electrically connected to the first redistribution wirings; a marking pattern on the second surface of the semiconductor chip; seed layer pads on respective end portions of the vertical conductive structures that are exposed by the sealing member at an upper surface thereof; and an upper redistribution wiring layer on the sealing member and the marking pattern, the upper redistribution wiring layer including second redistribution wirings on the seed layer pads. The sealing member is on a side surface of the marking pattern and is on side surfaces of the seed layer pads.

According to example embodiments, in a method of manufacturing a semiconductor package, an insulating layer and a seed layer are sequentially formed on a carrier substrate having a first region and a second region adjacent the first region. A plurality of vertical conductive structures is formed on the seed layer in the second region. A first laser is irradiated onto the seed layer on the second region to remove portions of the seed layer between the vertical conductive structures, to form seed layer pads under the vertical conductive structures. A second laser is irradiated onto the seed layer on the first region to form a marking pattern. A semiconductor chip is provided on the marking pattern in the first region such that a second surface of the semiconductor chip, which is opposite to a first surface thereof comprising chip pads, faces the insulating layer. A sealing member is formed on the insulating layer, on the semiconductor chip, and on the vertical conductive structures. A lower redistribution wiring layer is formed on first surface of the sealing member, the lower redistribution wiring layer having first redistribution wirings electrically connected to the chip pads and the vertical conductive structures. An upper redistribution wiring layer is formed on a second surface of the sealing member and on the marking pattern, the upper redistribution wiring layer having second redistribution wirings electrically connected to the vertical conductive structures.

According to example embodiments, a semiconductor package as a fan out wafer level package may include a lower redistribution wiring layer, a semiconductor chip on the lower redistribution wiring layer, a sealing member on at least a portion of the semiconductor chip and on an upper surface of the lower redistribution layer, a plurality of vertical conductive structures penetrating the sealing member, a marking pattern on a semiconductor chip, and an upper redistribution wiring layer on an upper surface of the sealing member.

The marking pattern may be on a backside surface of the semiconductor chip in a first region of the lower redistribution wiring layer. The marking pattern may include a seed layer dummy pattern and an intaglio pattern defined by through openings that are formed by irradiating a laser on the seed layer dummy pad. Even though the upper redistribution wiring layer may completely cover the marking pattern, the marking pattern may be identified through the upper redistribution wiring layer.

Instead of the exiting marking process of engraving an upper insulating layer of a PID material, the marking pattern may be formed by laser processing a portion of a seed layer that is used for forming the vertical conductive structures. Thus, the visibility of the marking pattern can be improved and the efficiency of the marking process can be improved.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is a plan view illustrating vertical conductive structures and a marking pattern in a sealing member of FIG. 1.

FIG. 3 is an enlarged cross-sectional view illustrating portion 'A' in FIG. 1.

FIGS. 4, 5, 6, 7, 8, 9, 10, 11, 12, 13, 14, 15, 16, 17, 18, and 19 are views illustrating a method of manufacturing a semiconductor package in accordance with example embodiments.

FIG. 20 is a cross-sectional view illustrating a semiconductor package in accordance with example embodiments.

FIG. 21 is a cross-sectional view illustrating a semiconductor package in accordance with example embodiments.

FIGS. 22, 23, 24, 25, and 26 are cross-sectional views illustrating a method of manufacturing a semiconductor package in accordance with example embodiments.

DETAILED DESCRIPTION OF EXAMPLE EMBODIMENTS

Hereinafter, example embodiments will be explained in detail with reference to the accompanying drawings. The terms "first," "second," etc., may be used herein merely to distinguish one component, layer, direction, etc. from another.

Figure 1:
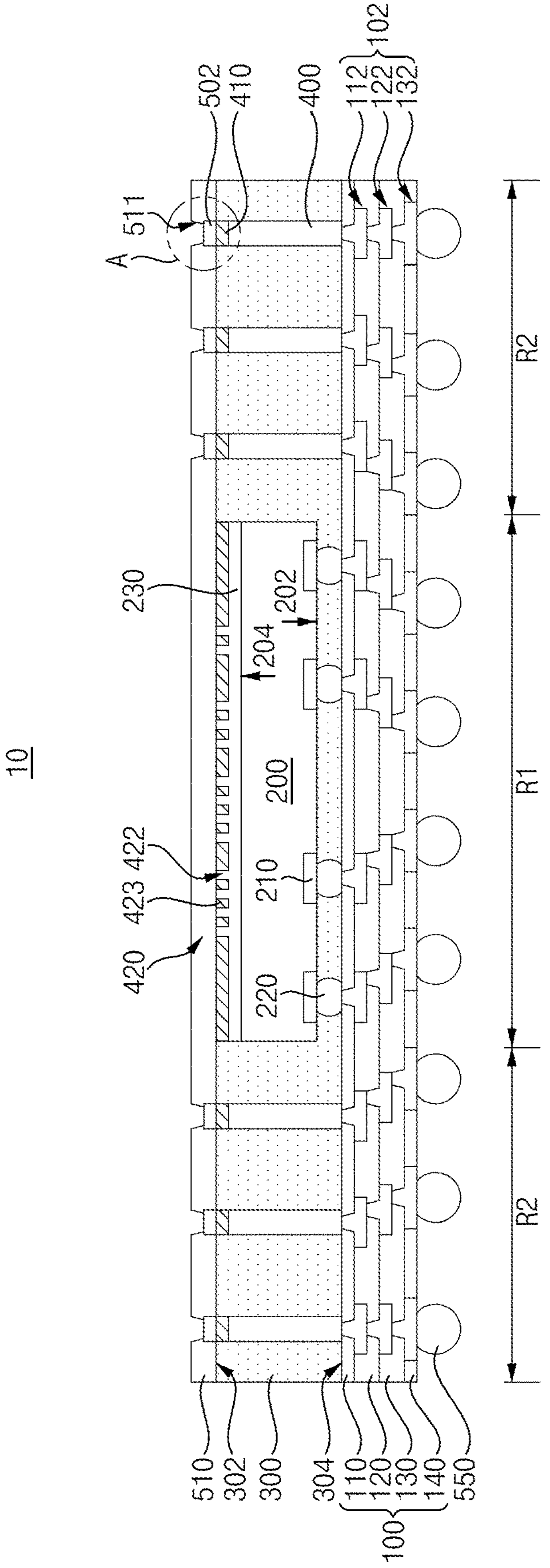
FIGS. 1 to 26 represent non-limiting, example embodiments as described herein.
Figure 2:
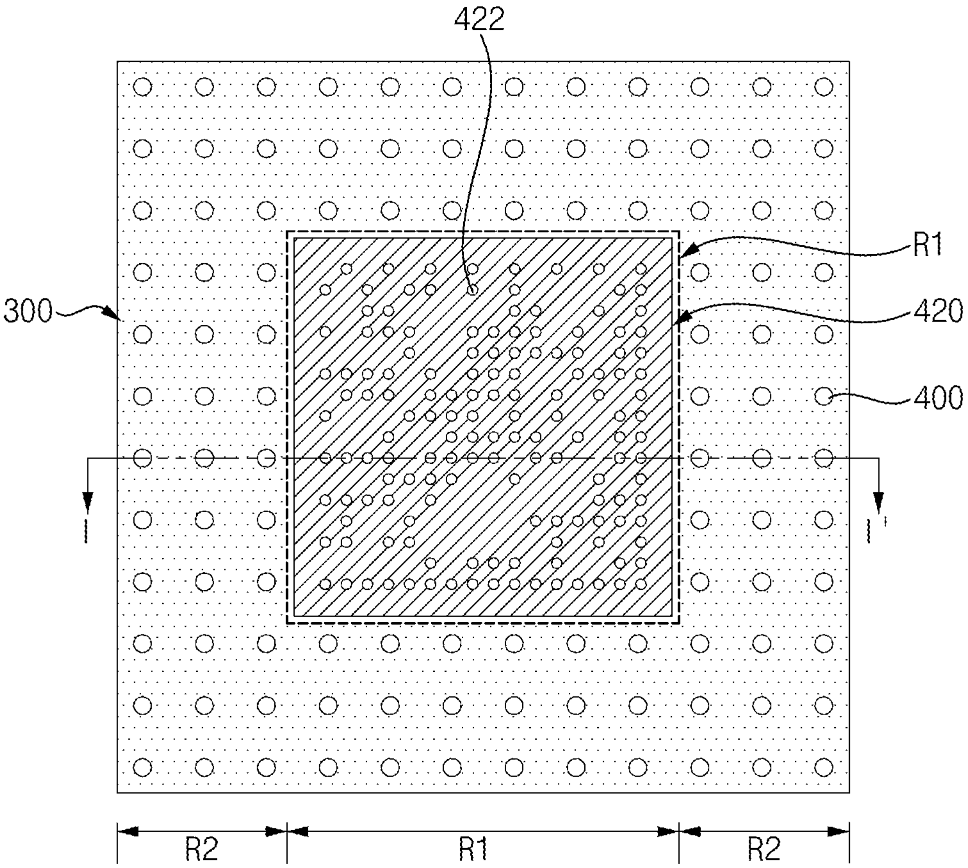
Figure 3:
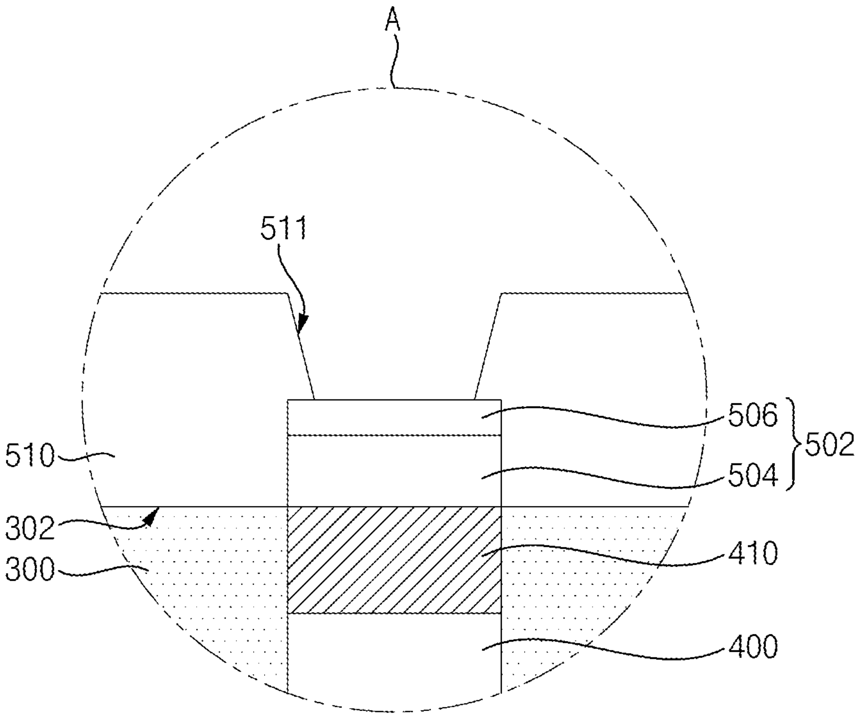

FIG. 1 is a cross-sectional view illustrating a semiconductor package in accordance with example embodiments. FIG. 2 is a plan view illustrating vertical conductive structures and a marking pattern in a sealing member of FIG. 1. FIG. 3 is an enlarged cross-sectional view illustrating portion 'A' in FIG. 1. FIG. 1 is a cross-sectional view taken along the line I-I' in FIG. 2.

Referring to FIGS. 1 to 3, a semiconductor package 10 may include a lower redistribution wiring layer 100, a semiconductor chip 200 disposed on the lower redistribution wiring layer 100, a sealing member 300 on an upper surface of the lower redistribution wiring layer 100 covering at least a portion of the semiconductor chip 200, a plurality of vertical conductive structures 400 penetrating the sealing member 300, a marking pattern 420 provided on the semiconductor chip 200, and an upper redistribution wiring layer 510 disposed on an upper surface 302 of the sealing member 300. In addition, the semiconductor package 10 may further include external connection members 550 disposed on an outer surface of the lower redistribution wiring layer 100.

In example embodiments, the semiconductor package 10 may be a fan-out package in which the lower redistribution wiring layer 100 extends to the sealing member 300 covering a side surface of the semiconductor chip 200. The lower redistribution wiring layer 100 may be formed by a wafer level redistribution wiring process. Additionally, the semiconductor package 10 may be provided as a unit package on which a second package is stacked.

Additionally, the semiconductor package 10 may be provided as a System In Package (SIP). For example, one or more semiconductor chips may be disposed on the lower redistribution wiring layer 100. The semiconductor chips may include a logic chip including a logic circuit and/or a memory chip. The logic chip may be a controller that controls memory chips. The memory chip may include various types of memory circuits, such as DRAM, SRAM, flash, PRAM, ReRAM, FeRAM, or MRAM.

In example embodiments, the lower redistribution wiring layer 100 may have first redistribution wirings 102. The semiconductor chip 200 may be disposed on the lower redistribution wiring layer 100 to be electrically connected to the first redistribution wirings 102. The lower redistribution wiring layer 100 may be provided on a front surface 202 of the semiconductor chip 200 to serve as a front redistribution wiring layer. Accordingly, the lower redistribution wiring layer 100 may be a front redistribution wiring layer (FRDL) of the fan-out package.

In particular, the lower redistribution wiring layer 100 may include a plurality of first, second, third and fourth lower insulating layers 110, 120, 130 and 140 and the first redistribution wirings 102 provided in the first, second, third and fourth lower insulating layers. The first redistribution wirings 102 may include first, second and third lower redistribution wirings 112, 122, and 132.

The first, second, third and fourth lower insulating layers may include a polymer or a dielectric layer. For example, the first, second, third and fourth lower insulating layers may include a photosensitive insulating layer such as photo imagable dielectric (PID). The first, second, third and fourth lower insulating layers may be formed by a vapor deposition process, a spin coating process, etc. The first redistribution wirings may include aluminum (Al), copper (Cu), tin (Sn), nickel (Ni), gold (Au), platinum (Pt), or an alloy thereof. The first redistribution may be formed by a plating process, an electroless plating process, a vapor deposition process, etc.

In particular, the first lower insulating layer 110 may be formed on a lower surface 304 of the sealing member 300, and first lower redistribution wirings 112 may be formed on the first lower insulating layer 110. The first lower redistribution wirings 112 may be electrically connected to conductive bumps 220 and vertical conductive structures 400 through first openings formed in the first lower insulating layer 110.

The second lower insulating layer 120 may be formed on the first lower insulating layer 110, and second lower redistribution wirings 122 may be formed on the second lower insulating layer 120. The second lower redistribution wirings 122 may be electrically connected to the first lower redistribution wirings 112 through second openings formed in the second lower insulating layer 120.

The third lower insulating layer 130 may be formed on the second lower insulating layer 120, and third lower redistribution wirings 132 may be formed on the third lower insulating layer 130. The third lower redistribution wirings 132 may be electrically connected to the second lower redistribution wirings 122 through third openings formed in the third lower insulating layer 130.

Package pads (not illustrated) may be formed on the third lower redistribution wirings 132. The fourth lower insulating layer 140 may be formed on the third lower insulating layer 130 to expose at least portions of the package pads on the third lower redistribution wirings 132. The fourth lower insulating layer 140 may serve as a passivation layer.

The number and arrangement of the lower insulating layers and the lower redistribution wirings of the lower redistribution wiring layer are provided as examples, and it will be understood that the present inventive concept is not limited thereto.

In example embodiments, when viewed from a plan view, the lower redistribution wiring layer 100 may include a first region R1 overlapping the semiconductor chip 200 mounted on the upper surface of the lower redistribution wiring layer 100 and a second region R2 adjacent or surrounding the first region R1. Components or layers described as "overlapping" may be at least partially obstructed by one another when viewed along a line extending in a particular direction or in a plane perpendicular to the particular direction. The second region R2 may be a fan-out region outside (e.g., extending around a periphery of) the region where the semiconductor chip 200 is disposed.

In example embodiments, the semiconductor chip 200 may have a plurality of chip pads 210 on the first surface 202, that is, an active surface. The semiconductor chip 200 may be mounted on the lower redistribution wiring layer 100 such that the first surface on which the chip pads 210 are formed faces the lower redistribution wiring layer 100.

The semiconductor chip 200 may be mounted on the lower redistribution wiring layer 100 via the conductive bumps 220. The conductive bumps 220 may be disposed between the first lower redistribution wiring 112 of the lower redistribution wiring layer 100 and the chip pads 210 of the semiconductor chip 200 to electrically connect them.

For example, each of the conductive bumps 220 may include a pillar bump formed on the chip pad 210 of the semiconductor chip 200 and a solder bump formed on the pillar bump. Alternatively, each of the conductive bumps 220 may include a solder bump formed on the chip pad 210 of the semiconductor chip 200.

Although only a few chip pads are illustrated in the figures, the structures and arrangements of the chip pads are provided as examples, and it will be understood that the present inventive concept is not limited thereto. Additionally, although only one semiconductor chip is illustrated, it may not be limited thereto, and a plurality of semiconductor chips may be stacked on the lower redistribution wiring layer.

In example embodiments, the sealing member 300 may be provided on the upper surface of the lower redistribution wiring layer 100 to extend on or cover at least a portion of the semiconductor chip 200. The sealing member 300 may include a first molding portion extending on or covering the first surface 202 of the semiconductor chip 200 and a second sealing portion extending on or covering the upper surface of the lower redistribution wiring layer 100 around the semiconductor chip 200. The sealing member 300 may expose a second surface 204 opposite to the first surface 202 of the semiconductor chip 200. The term "exposed" as may be used throughout the present specification to describe intermediate processes in fabricating a completed semiconductor device, is not intended to necessarily require exposure of the particular region, layer, structure or other element in the actual completed device. The second surface 204 of the semiconductor chip 200, that is, a backside surface may be exposed by the upper surface 302 of the sealing member 300.

For example, the sealing member 300 may include an epoxy mold compound (EMC). The sealing member 300 may be formed by a molding process, a screen printing process, a lamination process, etc.

In example embodiments, the plurality of vertical conductive structures 400 may extend in a vertical direction (with reference to the cross-sectional views) to penetrate the sealing member 300. The vertical conductive structure 400 may extend in the vertical direction from the first surface 302 to the second surface 304 of the sealing member 300. One end portion of the vertical conductive structure 400 may be exposed by the sealing member 300 at the second surface 304 of the sealing member 300. The vertical conductive structures 400 may be electrically connected to the first lower redistribution wirings 122 positioned in the second region R2. For example, the vertical conductive structures 400 may include a metal material such as copper (Cu).

The vertical conductive structure 400 may penetrate the sealing member 300 and serve as an electrical connection path. The vertical conductive structure 400 may serve as a through mold via (TMV) formed through the second sealing portion of the sealing member 300. That is, the vertical conductive structures 400 may be provided in the fan-out region R2 outside the region where the semiconductor chip 200 is disposed to electrically connect the lower redistribution wiring layer 100 and the upper redistribution wiring layer 510.

In example embodiments, the marking pattern 420 may be provided on the backside surface 204 of the semiconductor chip 200 in the first region R1. The marking pattern 420 may be exposed by the sealing member 300 at the upper surface 302 of the sealing member 300. An upper surface of the marking pattern 420 may be positioned on the same plane as (i.e., coplanar with) the first surface 302 of the sealing member 300. The sealing member 300 may extend on or cover a side surface of the marking pattern 420.

Additionally, seed layer pads 410 may be bonded to end portions of the vertical conductive structures 400 that are exposed from the first surface 302 of the sealing member 300 in the second region R2. An upper surface of the seed layer pad 410 may be positioned on the same plane as or lower than (e.g., recessed relative to) the first surface 302 of the sealing member 300. The seed layer pads 410 may be respectively disposed on the end portions of the vertical conductive structures 400. A diameter of the seed layer pad 410 may be the same as or smaller than a diameter of the vertical conductive structure 400 (e.g., when viewed in plan view). The sealing member 300 may extend on or cover a side surface of the seed layer pad 410.

The seed layer pad 410 and the marking pattern 420 may have the same or different metal layer structures. For example, the seed layer pad 410 and the marking pattern 420 may include a first seed layer and a second seed layer stacked on the first seed layer. Alternatively, the seed layer pad 410 may include a first seed layer, and the marking pattern 420 may include the first seed layer and a second seed layer stacked on the first seed layer. The first seed layer may include copper (Cu), and the second seed layer may include titanium (Ti). The seed layer pad 410 and the marking pattern 420 may have a thickness within a range of about 0.1 micrometers (μm) to about 0.5 μm. The first seed layer may have a thickness of 200 nm, and the second seed layer may have a thickness of 80 nm.

As illustrated in FIG. 2, the marking pattern 420 may be disposed on the backside surface 204 of the semiconductor chip 200 in the first region R1, and the vertical conductive structures 400 may be disposed in the sealing member 300 in the second region R2.

The marking pattern 420 may include a seed layer "dummy" (or non-functional) pattern 423 disposed in the first region R1 and an intaglio pattern 422 defined by a plurality of openings that are formed in the seed layer dummy pattern 423, for example, by irradiating a laser to or on the seed layer dummy pattern 423. The intaglio pattern 422 may represent information on a manufacturer, date of manufacture, serial number, and the like.

The marking pattern 420 may be attached to the backside surface 204 of the semiconductor chip 200 by an adhesive film 230. For example, the adhesive film 230 may include a die attach film (DAF). A thickness of the adhesive film 230 may be within a range of about 30 μm to about 120 μm. The semiconductor chip 200 to which the adhesive film 230 is attached may be attached on the marking pattern 420 by a thermal compression process. A portion of the DAF having fluidity due to the pressure and temperature of the thermal compression process may at least partially fill the intaglio pattern 422 of the marking pattern 420, that is, the openings of the seed layer dummy pattern 423.

In example embodiments, the upper redistribution wiring layer 510 may be disposed on the first surface 302 of the sealing member 300 and may include second redistribution wirings 502 electrically connected to the vertical conductive structures 400 respectively. The upper redistribution wiring layer 510 may completely cover the marking pattern 420. The second redistribution wirings 502 may be respectively provided on the seed layer pads 410 bonded to the end portions of the vertical conductive structures 400. The second redistribution wirings 502 may be provided on the sealing member 300 to serve as backside redistribution wirings. Accordingly, the upper redistribution wiring layer 510 may be a backside redistribution wiring layer (BRDL) of the fan-out package.

For example, the second redistribution wiring 502 may include a first plating pattern 504 and a second plating pattern 506 sequentially formed on the seed layer pad 410. In this case, the first plating pattern 504 may include nickel (Ni), and the second plating pattern 506 may include gold (Au). Here, the seed layer pad 410 may include a copper (Cu) seed layer, and the first plating pattern 504 may be formed on the copper (Cu) seed layer.

Alternatively, the second redistribution wiring 502 may include a single plating pattern on the seed layer pad 410. In this case, the plating pattern may include gold (Au). Here, the seed layer pad 410 may include a titanium (Ti) seed layer and a copper (Cu) seed layer, and the gold (Au) plating pattern may be formed on the copper (Cu) seed layer.

The upper redistribution wiring layer 510 may be provided on the upper surface 302 of the sealing member 300 and may have openings that expose the seed layer pads 410 on the vertical conductive structures 400. The second redistribution wirings 502 may be respectively formed on the seed layer pads 410.

For example, the upper redistribution wiring layer may include a polymer or a dielectric layer. The upper redistribution wiring layer may include a photosensitive insulating material (PID) or an insulating layer such as ABF. The upper redistribution wiring layer may have a thickness of about 20 μm or less. The second redistribution wirings may include copper (Cu), aluminum (Al), tin (Sn), nickel (Ni), gold (Au), platinum (Pt), or an alloy thereof.

The upper redistribution wiring layer 510 may have the second redistribution wirings 502 stacked in one level on the first surface 302 of the sealing member 300. The second redistribution wirings 502 may correspond to uppermost redistribution wirings, and may serve as bonding pads on which solder bumps for electrical connection with the second package are disposed.

Alternatively, the upper redistribution wiring layer may include first upper redistribution wirings and second upper redistribution wirings stacked in at least two levels. In this case, the upper redistribution wiring layer may include a plurality of stacked upper insulating layers, the first upper redistribution wirings may correspond to the second redistribution wirings 502, and the second upper redistribution wirings may serve as bonding pads on which solder bumps for electrical connection with the second package are disposed.

The number and arrangement of the upper redistribution wiring layer and the second redistribution wirings are provided as examples, and it will be understood that the present inventive concept is not limited thereto.

In example embodiments, external connection members 550 may be disposed on the package pads on the outer or external surface of the lower redistribution wiring layer 100. For example, the external connection member 550 may include a solder ball. The solder balls may have a diameter of about 300 μm to about 500 μm. The semiconductor package 10 may be mounted on a module substrate (not illustrated) via the solder balls to form a memory module.

As mentioned above, the semiconductor package 10 as the fan-out wafer level package may include the lower redistribution wiring layer 100, the semiconductor chip 200 disposed on the lower redistribution wiring layer 100, the sealing member 300 on the upper surface of the lower redistribution wiring layer 100 and covering at least a portion of the semiconductor chip 200, the plurality of vertical conductive structures 400 penetrating the sealing member 300, the marking pattern 420 provided on the semiconductor chip 200, and the upper redistribution wiring layer 510 disposed on the upper surface 302 of the sealing member 300.

The marking pattern 420 may be provided on the backside surface 204 of the semiconductor chip 200 in the first region R1 of the lower redistribution wiring layer 100. The marking pattern 420 may include the intaglio pattern 422 formed (for example) by irradiating a laser to or on a portion of the seed layer pad disposed in the first region R1. The laser may form the openings penetrating the seed layer dummy pattern 423, and the intaglio pattern 422 may be defined by the openings. Even though the upper redistribution wiring layer 510 may completely cover the marking pattern 420, the marking pattern 420 may be identified through the upper redistribution wiring layer 510. For example, the upper redistribution wiring layer 510 may include at least partially transparent portions such that the marking pattern 420 may be visible through the portions of the upper redistribution wiring layer 510 thereon.

By forming the marking pattern 420 by laser processing a portion of the seed layer for forming the vertical conductive structures 400, the existing marking process of forming an upper insulating layer of a PID material may be omitted, and the visibility of the marking pattern may be improved.

Hereinafter, a method of manufacturing the semiconductor package of FIG. 1 will be described.

Figure 10:
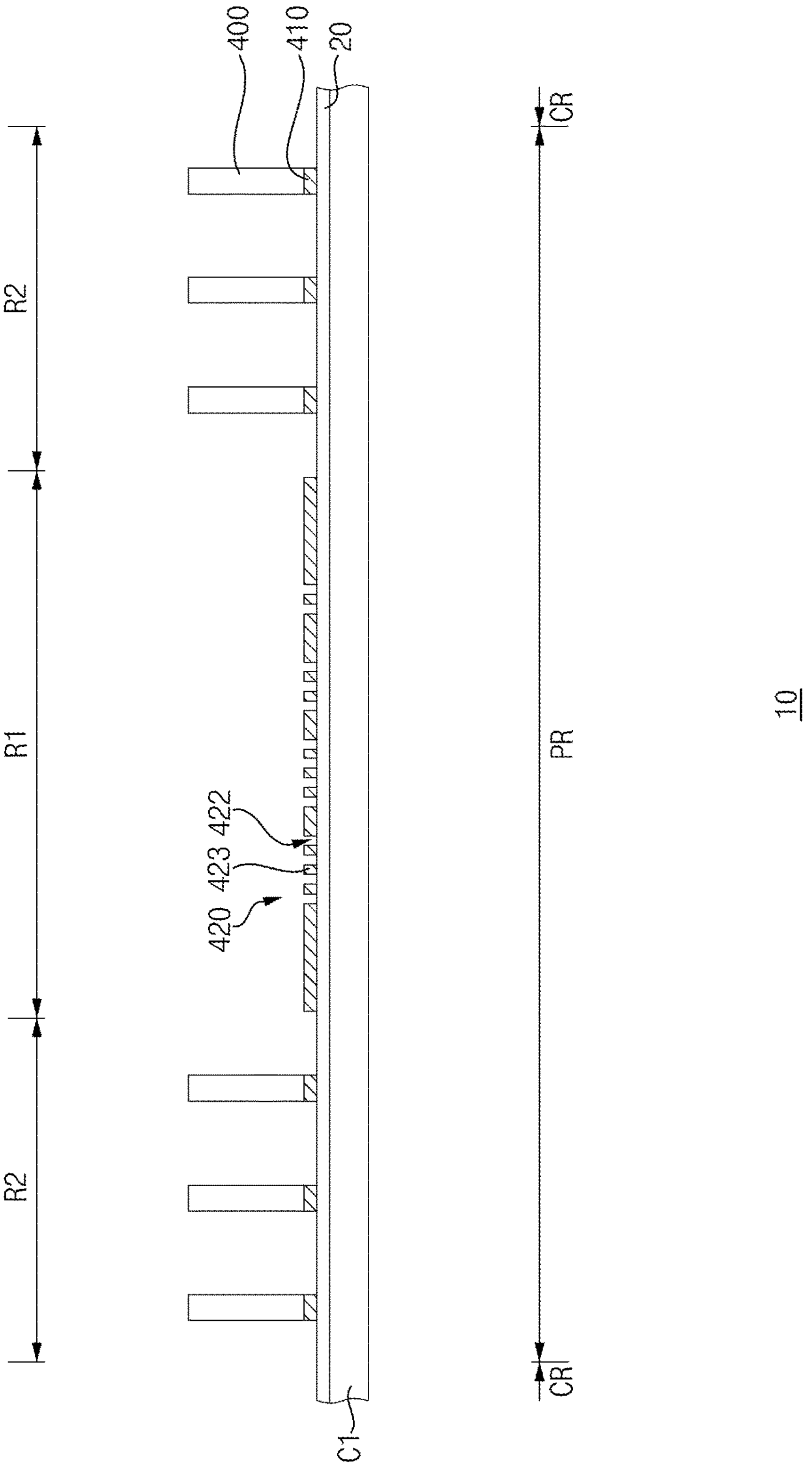
Figure 11:
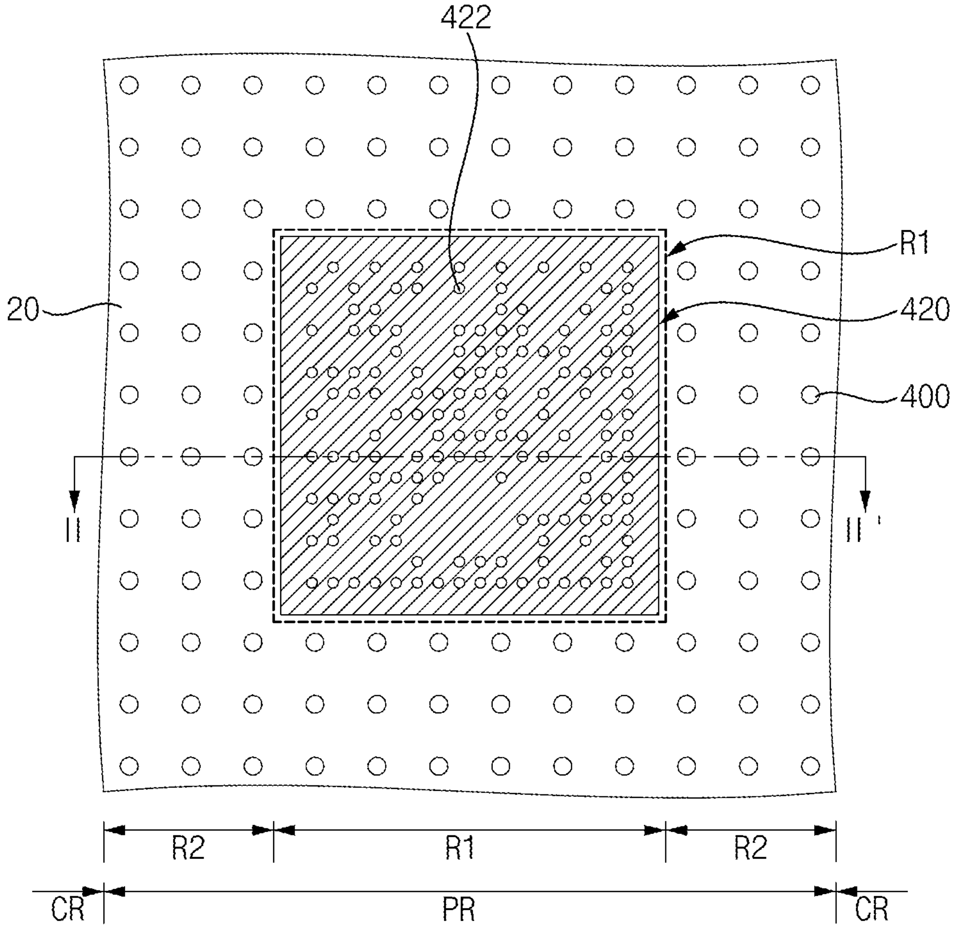

FIGS. 4 to 19 are views illustrating a method of manufacturing a semiconductor package in accordance with example embodiments. FIGS. 4 to 10, 12 to 16, 18 and 19 are cross-sectional views illustrating a method of manufacturing a semiconductor package in accordance with example embodiments. FIG. 11 is a plan view of FIG. 10. FIG. 17 is an enlarged cross-sectional view illustrating portion 'B' in FIG. 16. FIG. 10 is a cross-sectional view taken along the line II-II' in FIG. 11.

Referring to FIGS. 4 to 11, vertical conductive structures 400 and marking patterns 420 may be formed on a first carrier substrate C1.

Figure 4:
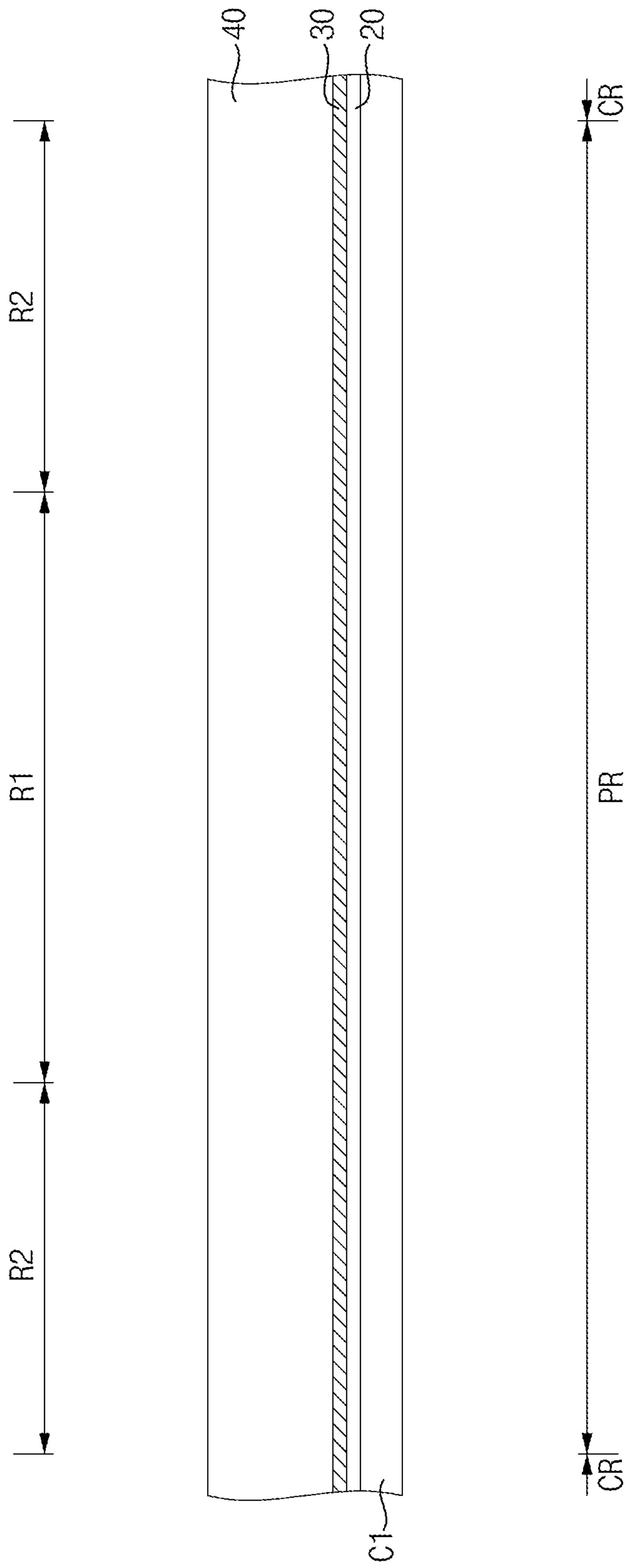

First, as illustrated in FIG. 4, an insulating layer 20 and a seed layer 30 may be sequentially formed on the first carrier substrate C1, and a photoresist layer 40 may be formed on the seed layer 30.

In example embodiments, the first carrier substrate C1 may include a wafer substrate as a base substrate for disposing a plurality of semiconductor chips and forming a sealing member on or covering the semiconductor chips. The first carrier substrate C1 may have a shape corresponding to a wafer on which a semiconductor process is performed. For example, the first carrier substrate C1 may include a silicon substrate, a glass substrate, a non-metal or metal plate, etc.

The first carrier substrate C1 may include a package region PR on which the semiconductor chip is mounted and a cutting region CR adjacent or surrounding the package region PR. As will be described below, a lower redistribution wiring layer 100 and the sealing member formed on the first carrier substrate C1 may be cut along the cutting region CR dividing the plurality of package regions PR to be individualized or singulated.

Additionally, the first carrier substrate C1 may include a first region R1 overlapping the semiconductor chip and a second region R2 adjacent or surrounding the first region R1. The second region R2 may be a fan-out region outside the region where the semiconductor chip is disposed.

The insulating layer 20 may be formed on the first carrier substrate C1 by a spin coating process, a vapor deposition process, etc. For example, the insulating layer 20 may include a dielectric material such as oxide, nitride, carbide, carbonitride, polyimide, polyimide derivative, polybenzooxazole (PBO), etc. The insulating layer 20 may be formed to have a thickness within a range of about 0.1 μm to about 10 μm.

The insulating layer 20 may include a polymer tape serving as a temporary adhesive. The insulating layer 20 may include a material that may lose adhesive strength when irradiated with light or heated. For example, the insulating layer 20 may be lifted off from the first carrier substrate C1 such as a glass substrate by irradiation of ultraviolet rays or visible rays.

The seed layer 30 may be formed on the insulating layer 20 by a sputtering process. The seed layer 30 may have a multilayer structure in which different metal layers are stacked. The seed layer 30 may be formed to have a thickness within a range of about 0.1 μm to about 0.5 μm. For example, the seed layer 30 may include a first seed layer and a second seed layer stacked on the first seed layer. The first seed layer may include titanium (Ti), and the second seed layer may include copper (Cu). The first seed layer may have a thickness of about 80 nm, and the second seed layer may have a thickness of about 200 nm.

Figure 5:
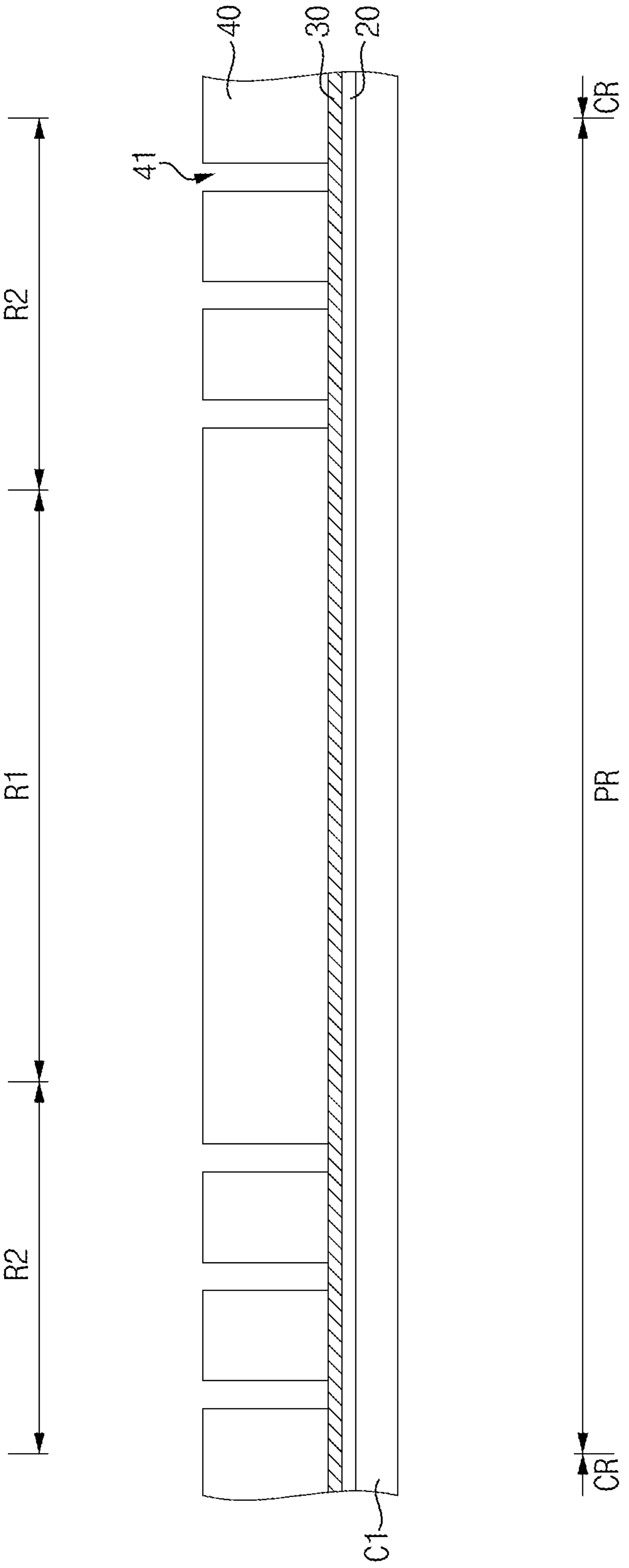
Figure 6:
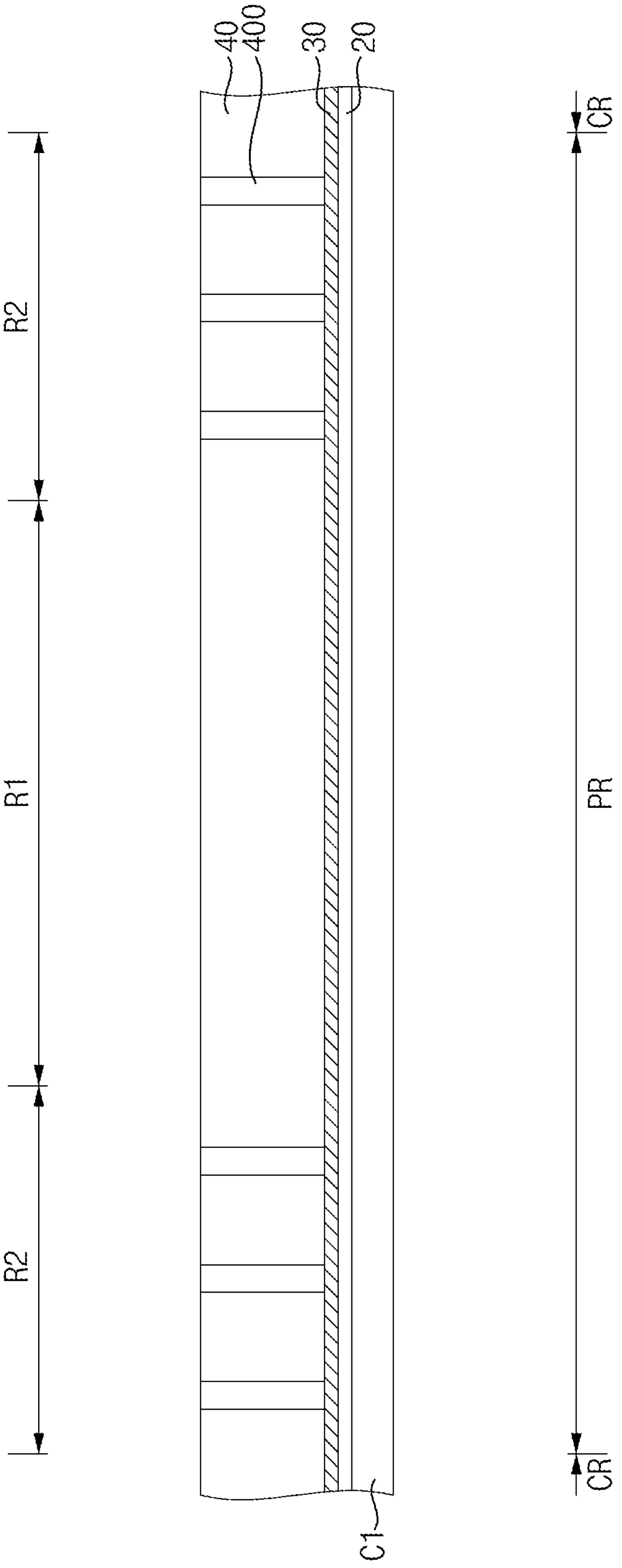

As illustrated in FIGS. 5 and 6, the photoresist layer 40 may be patterned to form a photoresist pattern having openings 41 that expose vertical conductive structure regions on the seed layer 30, and a plating process may be performed on exposed regions of the seed layer 30 to fill the openings 41 with a conductive material to form the vertical conductive structures 400 respectively. For example, the vertical conductive structures 400 may include a metal material such as copper (Cu).

Figure 7:
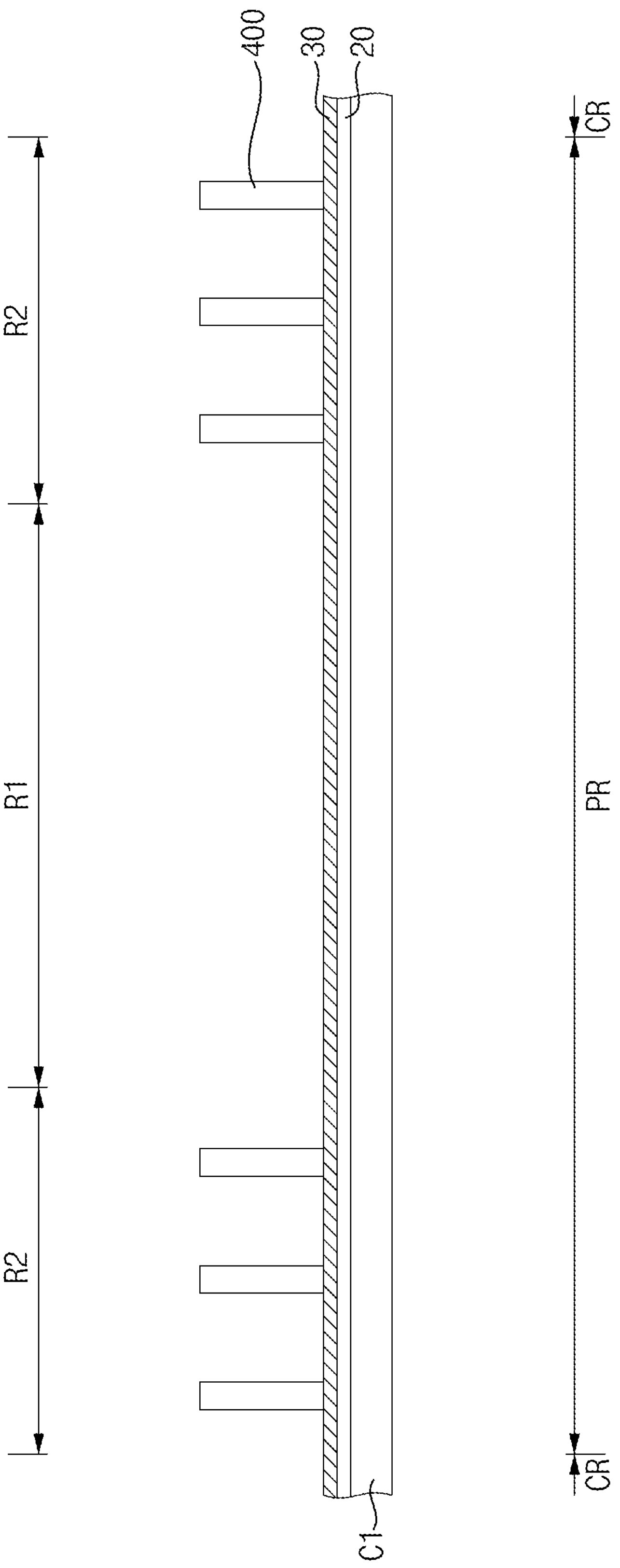

As illustrated in FIG. 7, the photoresist pattern may be removed from the first carrier substrate C1 to form the vertical conductive structures 400 in the second region R2 of the first carrier substrate C1. The vertical conductive structures 400 may be spaced apart from each other on the seed layer 30 in the second region R2.

Figure 8:
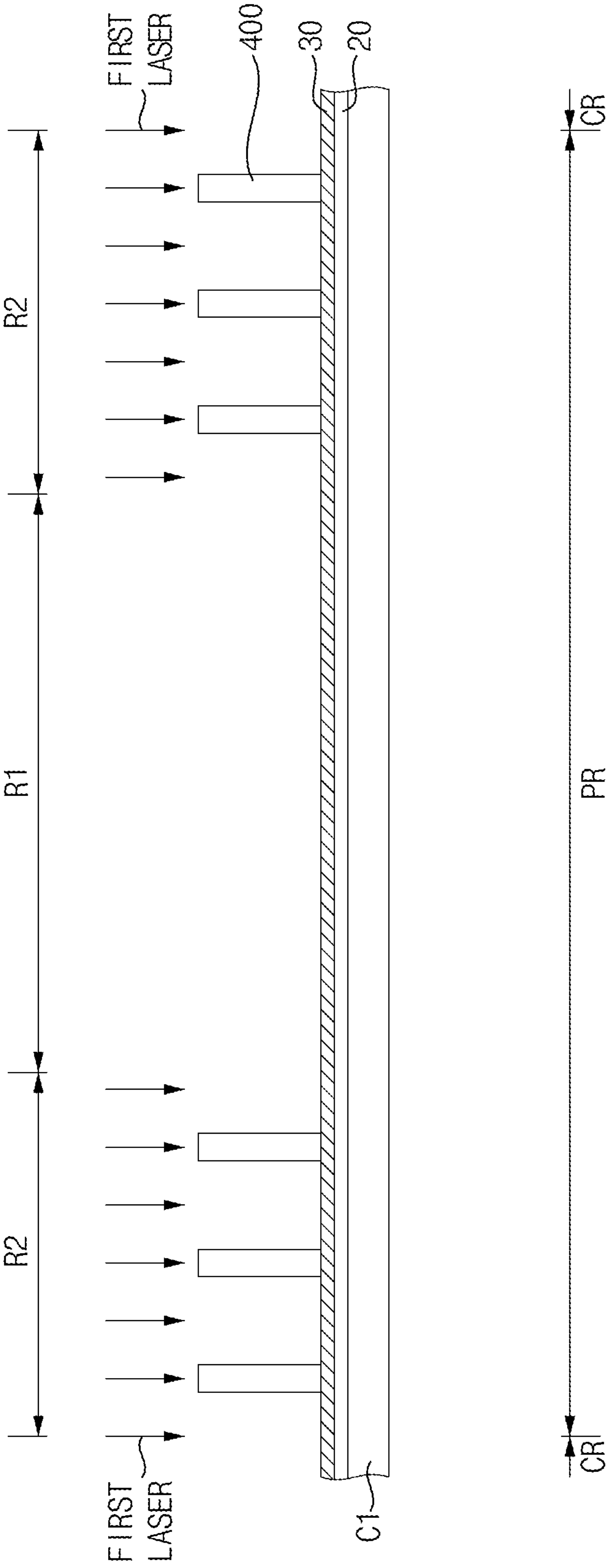
Figure 9:
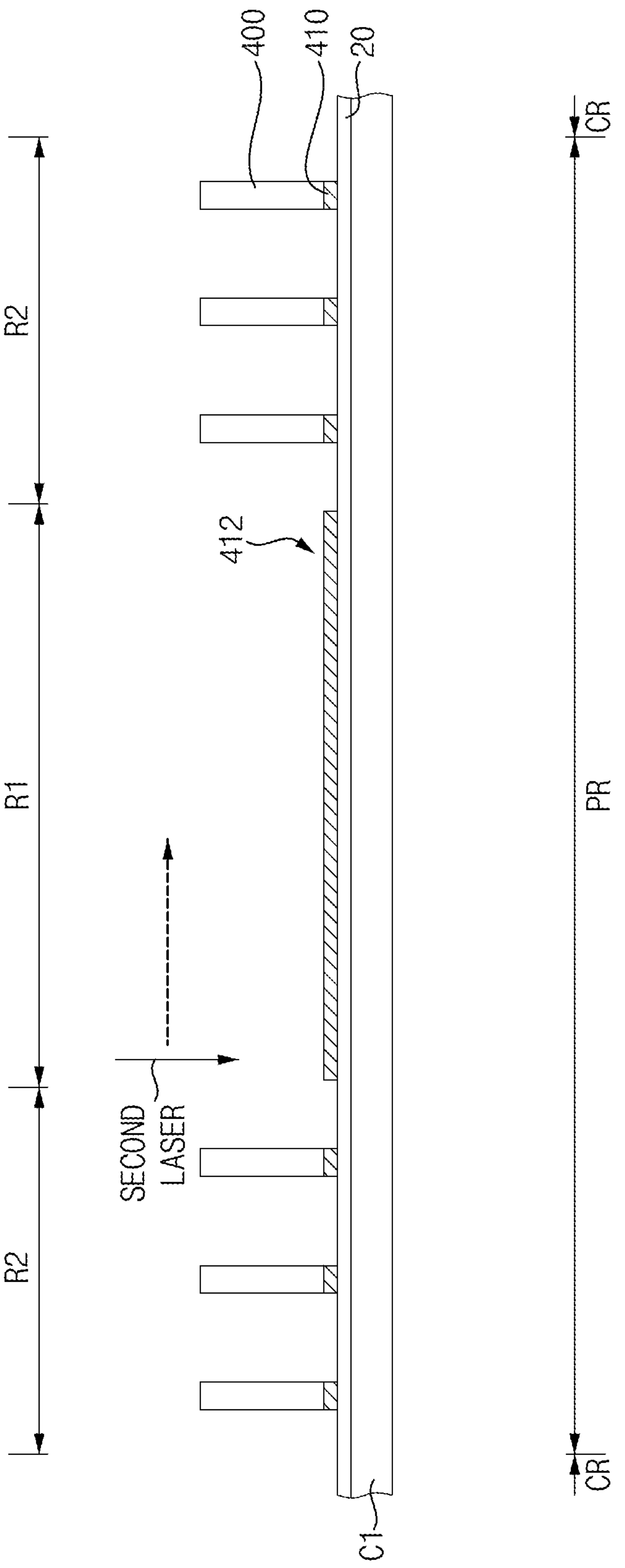

As illustrated in FIGS. 8 and 9, a first laser may be irradiated on the seed layer 30 in the second region R2 to remove portions of the seed layer that are between and are exposed by the vertical conductive structures 400, to form seed layer pad 410*s*. At the same time, as the portions of the seed layer in the second region R2 are removed, a seed layer pad 412 for a marking pattern may remain in the first region R1.

The portions of the seed layer 30 in the second region R2 may be partially removed by a laser lift-off device. The laser lift-off device may irradiate the first laser onto the seed layer 30 in the second region R2. The laser lift-off device may include an excimer laser device, a diode pumped solid state laser device, etc. The first laser may include a laser having a wavelength of about 308 nm or about 343 nm. The first laser may have a laser cross-sectional shape such as a Gaussian beam or a flat-top beam.

When the first laser is irradiated onto the seed layer 30, only the thin seed layer portion on the polyimide insulating layer 20 exposed by the vertical conductive structures 400 may absorb photon energy by a shock wave effect and then may be lifted off from the insulating layer 20. At this time, the vertical conductive structures 400 including copper may not react with the first laser and may maintain original shapes.

Accordingly, the seed layer pad 410*s* left by or remaining after the laser lift-off may be positioned under the vertical conductive structures 400. A diameter of the seed layer pads 410 may be the same as or smaller than a diameter of the vertical conductive structures 400.

Then, as illustrated in FIGS. 9 to 11, a second laser may be irradiated onto the seed layer pad 412 for the marking pattern in the first region R1 to form a marking pattern 420.

The marking pattern 420 may be formed by a laser processing device. The laser processing device may include an excimer laser device, a diode pumped solid state laser device, etc. The second laser may include a laser having a wavelength of about 355 nm or about 532 nm.

The laser processing device may include a scanner optical system to form an intaglio pattern 422 in the seed layer pad 412 for the marking pattern. The intaglio pattern 422 may represent information on a manufacturer, date of manufacture, serial number, etc. The second laser may form openings that penetrate the seed layer pad 412 to define a seed layer dummy pattern 423 and the intaglio pattern 422 may be defined by the openings.

Figure 12:
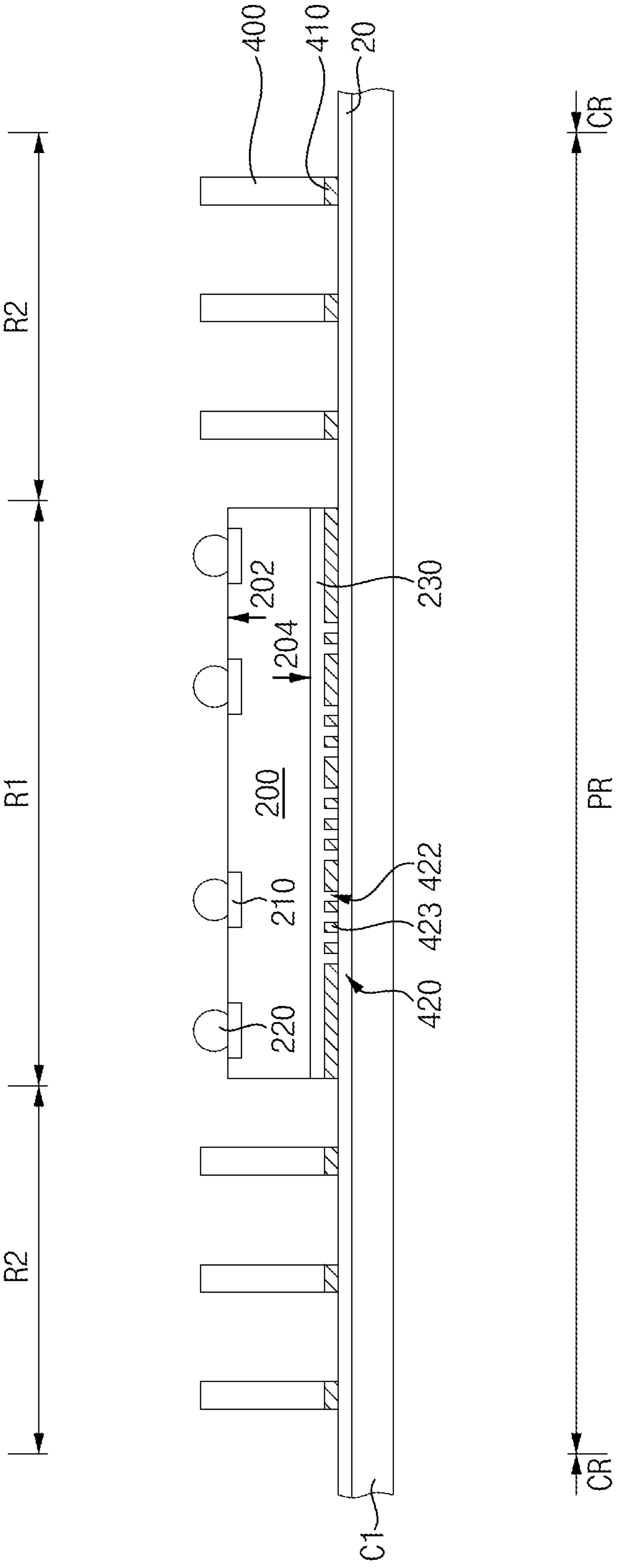

Referring to FIG. 12, at least one semiconductor chip 200 may be disposed on the first carrier substrate C1.

In example embodiments, conductive bumps 220 may be formed on chip pads 210 of the semiconductor chip 200, and the semiconductor chip 200 may be disposed such that a backside surface 204 opposite to a front surface 202 on which the chip pads 210 are formed, that is, an active surface faces the first carrier substrate C1. The semiconductor chip 200 may be disposed in the first region R1, that is, a fan-in region of the first carrier substrate C1. The plurality of vertical conductive structures 400 may be disposed in the second region R2 around the semiconductor chip 200.

Each of the conductive bumps 220 may include a pillar bump formed on the chip pad 210 of the semiconductor chip 200 and a solder bump formed on the pillar bump. Alternatively, each of the conductive bumps 220 may include a solder bump formed on the chip pads 210 of the semiconductor chip 200.

In example embodiments, the semiconductor chip 200 may be attached to the marking pattern 420 on the insulating layer 20 by an adhesive film 230. For example, the adhesive film 230 may include a die attach film (DAF). A thickness of the adhesive film 230 may be within a range of about 30 μm to about 120 μm.

For example, an adhesive film 230 may be attached to the backside surface 204 of the semiconductor chip 200, and the semiconductor chip 200 to which the adhesive film 230 is attached may be attached onto the marking pattern 420 on the insulating layer 20 by a thermal compression process. The semiconductor chip 200 may be pressed onto the marking pattern 420 by a die attaching tool and heated to a high temperature by a heater block in a support system supporting the first carrier substrate C1. A portion of the DAF having fluidity due to the pressure and temperature of the thermal compression process may at least partially fill the intaglio pattern 422 of the marking pattern 420, that is, the openings of the marking pattern 420.

Figure 13:
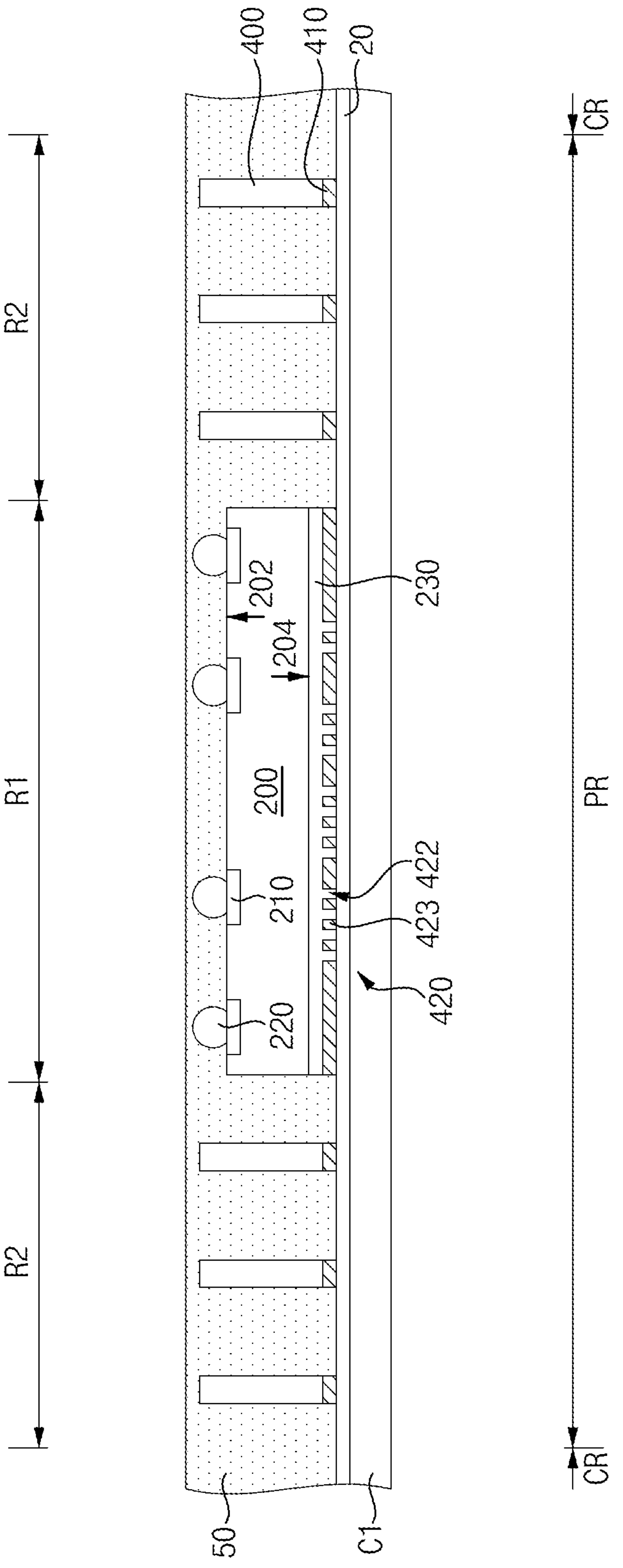
Figure 14:
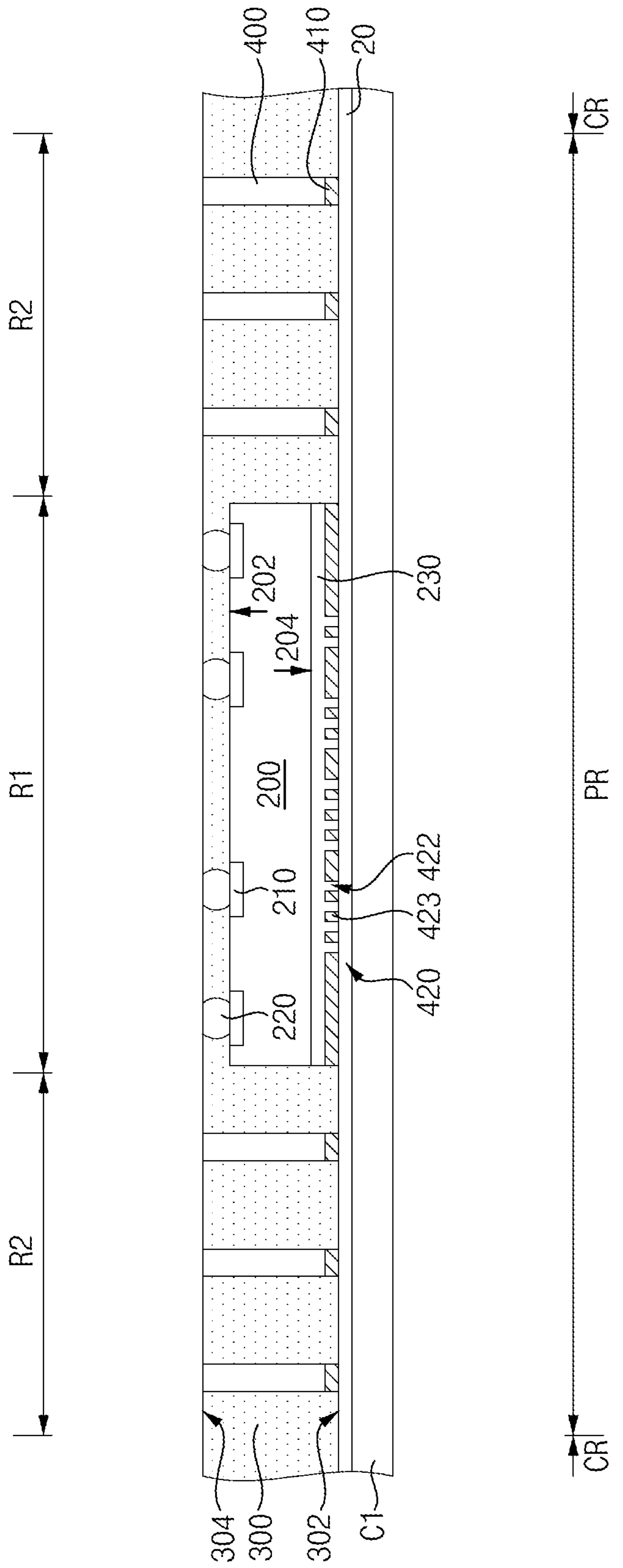

As illustrated in FIGS. 13 and 14, a sealing material 50 may be formed on the first carrier substrate C1 to cover the semiconductor chip 200 and the plurality of vertical conductive structures 400, and an upper portion of the sealing material 50 may be partially removed to form a sealing member 300 that exposes upper surfaces of the conductive bumps 220 on the front surface 202 of the semiconductor chip 200 and the plurality of vertical conductive structures 400.

The sealing material 50 may be formed to cover the front surface 202 of the semiconductor chip 200 and the upper surfaces of the plurality of vertical conductive structures 400. For example, the sealing material 50 may include an epoxy molding compound (EMC).

The upper portion of the sealing material 50 may be partially removed by a grinding process. As the upper portion of the sealing material 50 is removed, the conductive bumps 220 on the front surface 202 of the semiconductor chip 200 and the plurality of vertical conductive structures 400 may be exposed from a second surface 304 of the sealing member 300. The sealing member 300 may include a first sealing portion on or covering the front surface 202 of the semiconductor chip 200 and a second sealing portion on or covering a side surface of the semiconductor chip 200. The upper surfaces of the conductive bumps 220 on the front surface 202 of the semiconductor chip 200 may be exposed by the first sealing portion of the sealing member 300.

The sealing member 300 may cover outer surfaces of the vertical conductive structures 400. The sealing member 300 may cover outer surfaces of the seed layer pads 410 under the vertical conductive structures 400. The sealing member 300 may cover the outer surface of the marking pattern 420.

Figure 15:
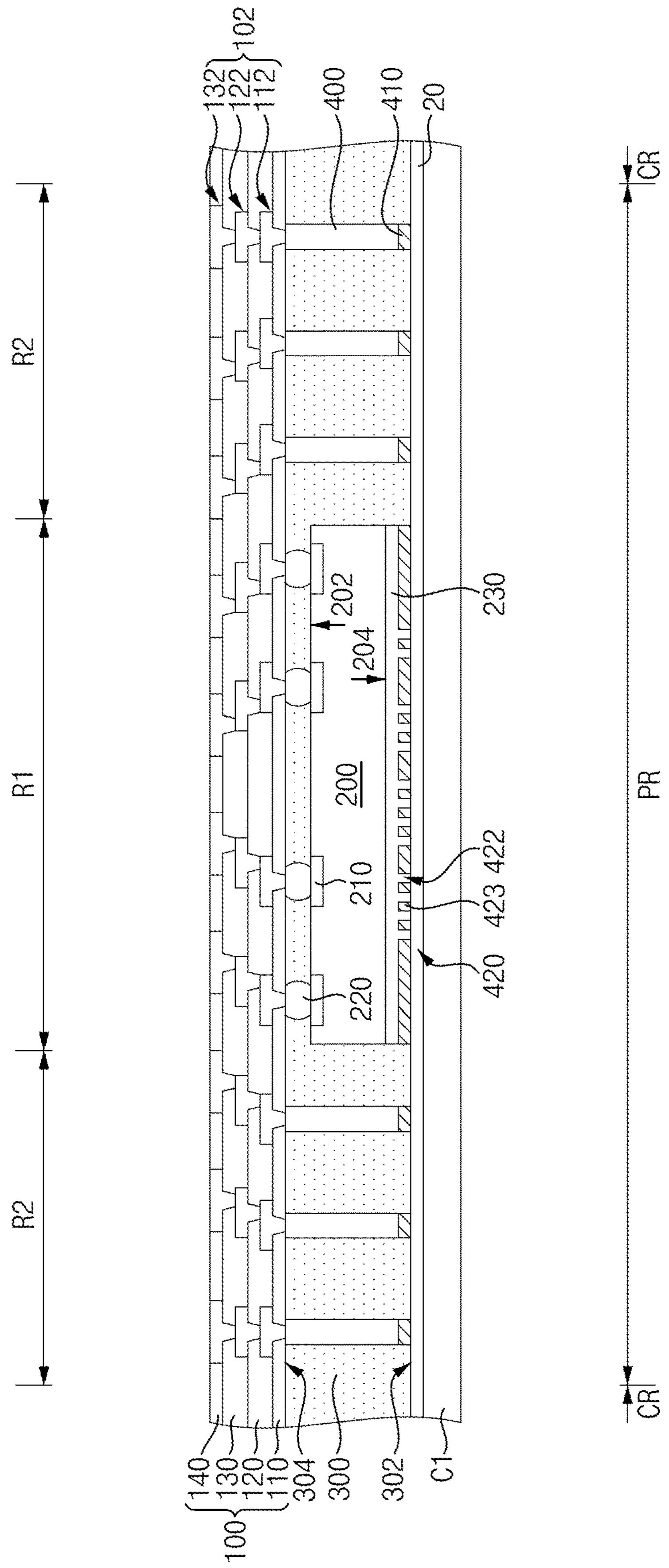

Referring to FIG. 15, a lower redistribution wiring layer 100 having first redistribution wirings 102 may be formed on the second surface 304 of the sealing member 300 and the front surface 202 of the semiconductor chip 200.

In example embodiments, after a first lower insulating layer 110 is formed on the second surface 304 of the sealing member 300 and the front surface of the semiconductor chip 200, the first lower insulating layer 110 may be patterned to form openings that expose the vertical conductive structures 400 and the conductive bumps 220. Some of the openings of the patterned first lower insulating layer 110 may expose the vertical conductive structures 400 and others of the openings may expose the conductive bumps 220.

After a seed layer is forming on the vertical conductive structures 400 and the conductive bumps 220 and in the openings, the seed layer may be patterned and an electroplating process may be performed to form first lower redistribution wirings 112. Accordingly, at least portions of the first lower redistribution wirings 112 may directly contact end portions of the vertical conductive structures 410 and the conductive bumps 220 through the openings of the first lower insulating layer 110. As used herein, when components or layers are referred to as “directly on” or “directly connected” to one another, no intervening components or layers are present.

The first lower insulating layer may be formed by a vapor deposition process, a spin coating process, etc. The first lower redistribution wiring may include aluminum (Al), copper (Cu), tin (Sn), nickel (Ni), gold (Au), platinum (Pt), or an alloy thereof. The first lower redistribution wiring may be formed by a plating process, an electroless plating process, a vapor deposition process, etc.

Similarly, after a second lower insulating layer 120 is formed on the first lower insulating layer 110, the second lower insulating layer 120 may be patterned to form openings that expose the first lower redistribution wirings 112. Then, second lower redistribution wirings 122 may be formed on the second lower insulating layer 120 to directly contact the first lower redistribution wirings 112 through the openings of the second lower insulating layer.

Then, after a third lower insulating layer 130 is formed on the second lower insulating layer 120, the third lower insulating layer 130 may be patterned to form openings that expose the second lower redistribution wirings 122. Then, third lower redistribution wirings 132 may be formed on the third lower insulating layer 130 to directly contact the second lower redistribution wirings 122 through the openings of the third lower insulating layer 130.

Then, package pads (not illustrated) may be formed on the third lower redistribution wirings 132, and a fourth lower insulating layer 140 may be formed on the third lower insulating layer 130 to expose at least portions of the package pads on the third lower redistribution wirings 132. The fourth lower insulating layer 140 may serve as a passivation layer.

Referring to FIGS. 16 to 19, an upper redistribution wiring layer 510 having second redistribution wirings 502 electrically connected to the vertical conductive structures 400 may be formed on a first surface 302 of the sealing member 300.

Figure 16:
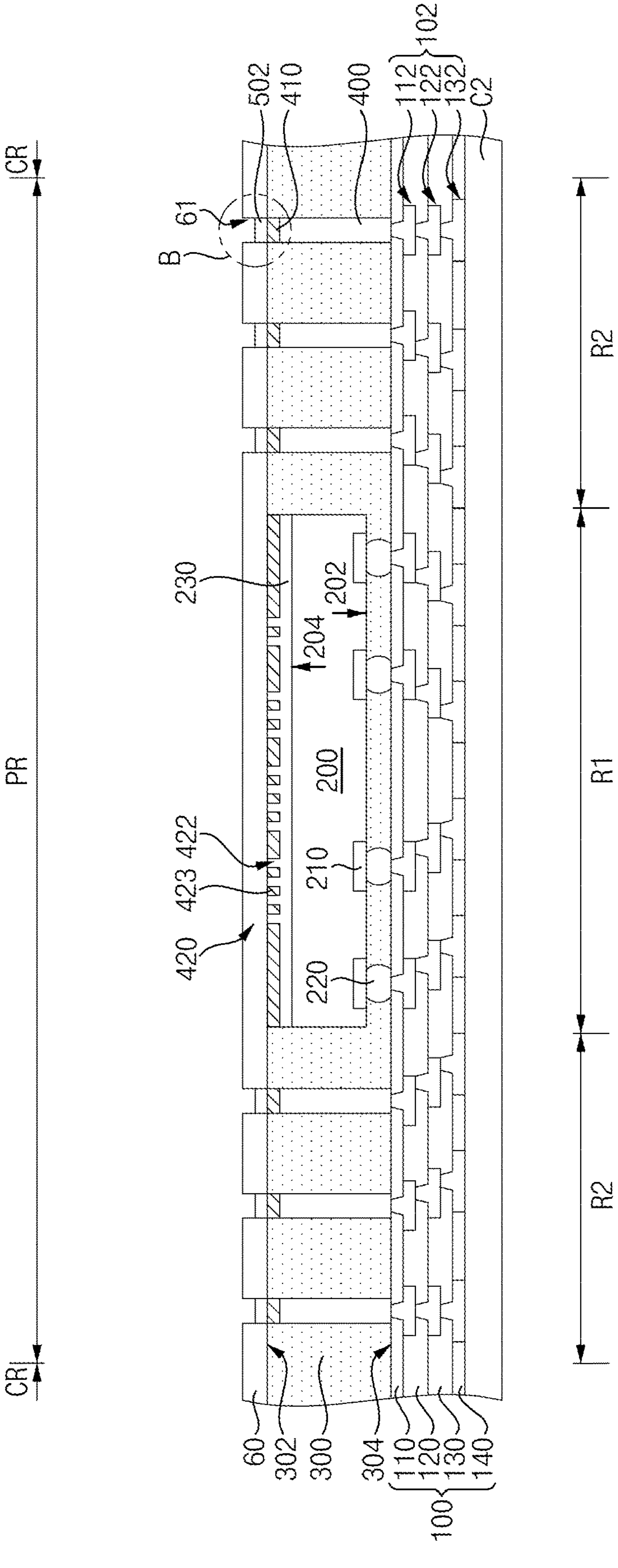
Figure 17:
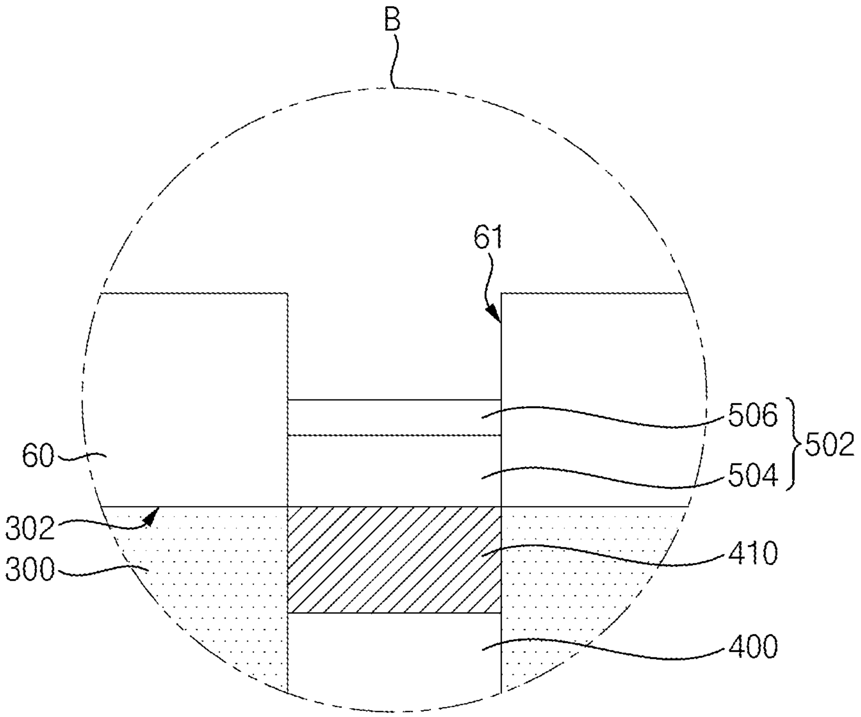

As illustrated in FIGS. 16 and 17, after removing the first carrier substrate C1, the structure of FIG. 15 may be turned over, and the second redistribution wirings 502 may be formed on the first surface 302 of the sealing member 300 to be electrically connected to the vertical conductive structures 400.

For example, UV light may be irradiated on the insulating layer 20 through the first carrier substrate C1 to remove the first carrier substrate C1, and the lower redistribution wiring layer 100 may be placed on a second carrier substrate C2. In this case, the marking pattern 420 in the first region R1 may be exposed from or at the first surface 302 of the sealing member 300. An upper surface of the marking pattern 420 may be coplanar with the first surface 302 of the sealing member 300. In addition, the seed layer pads 410 bonded to respective end portions of the vertical conductive structures 400 in the second region R2 may be exposed from or at the first surface 302 of the sealing member 300.

Then, a photoresist pattern 60 having openings 61 that expose the seed layer pad 410 bonded to one end portions of the vertical conductive structures 400 may be formed on the first surface 302 of the sealing member 300, and an electrolytic plating process t may be performed to fill the openings 61 of the photoresist pattern 60 with a conductive material to form the second redistribution wirings 502.

For example, the second redistribution wirings 502 may include a first plating pattern 504 and a second plating pattern 506 sequentially formed on the seed layer pad 410. In this case, the first plating pattern 504 may include nickel (Ni), and the second plating pattern 506 may include gold (Au). When the seed layer pad 410 includes a titanium (Ti) seed layer and a copper (Cu) seed layer, the titanium (Ti) seed layer exposed from or at the first surface 302 of the sealing member 300 may be removed and then the first and second plating patterns 504 and 506 may be sequentially formed on the copper (Cu) seed layer.

Alternatively, the second redistribution wiring 502 may include a single plating pattern on the seed layer pad 410. In this case, the plating pattern may include gold (Au). When the seed layer pad 410 includes a titanium (Ti) seed layer and a copper (Cu) seed layer, the titanium (Ti) seed layer exposed from or at the first surface 302 of the sealing member 300 may not be removed, and the gold (Au) plating pattern may be formed on the titanium (Ti) seed layer.

Figure 18:
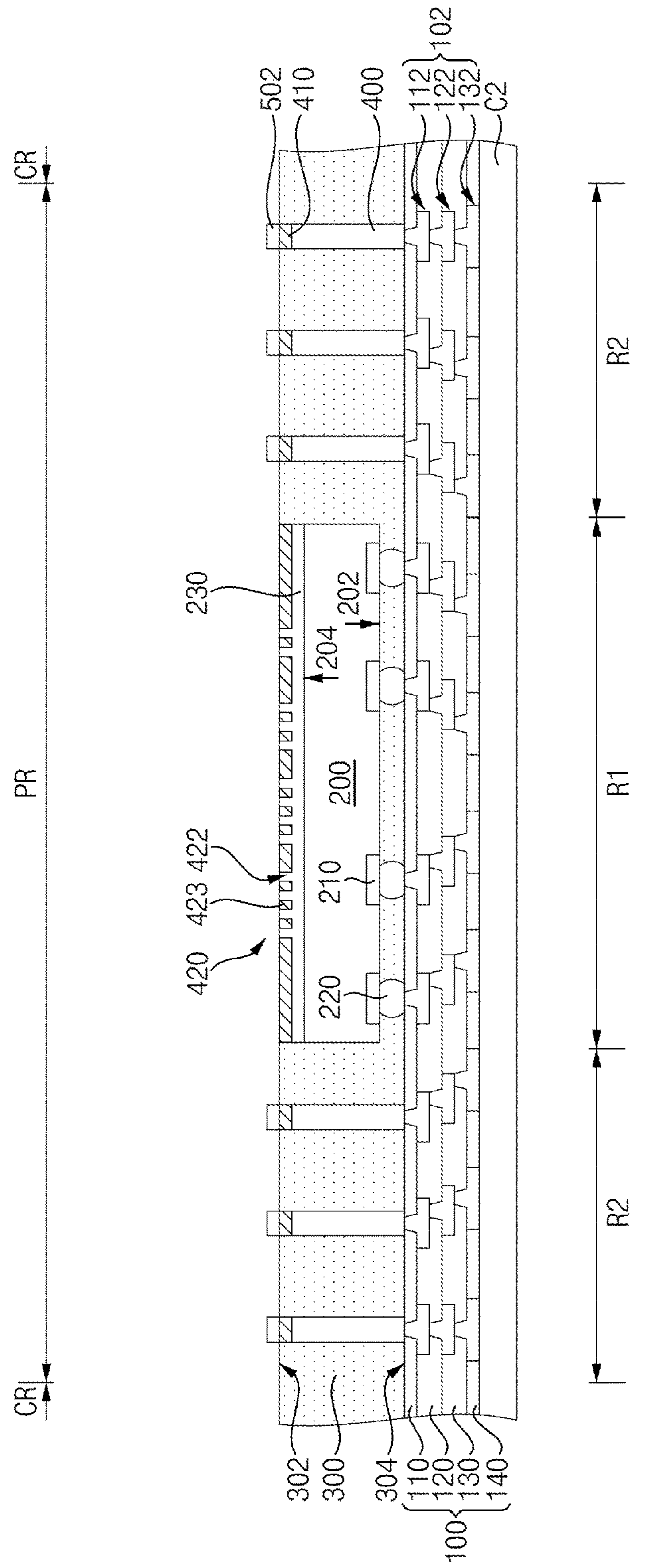

As illustrated in FIG. 18, the photoresist pattern 60 may be removed to form the second redistribution wirings 502 on the first surface 302 of the sealing member 300. The second redistribution wirings 502 may be electrically connected to the seed layer pads 410 bonded to respective end portions of the vertical conductive structures 400.

Figure 19:
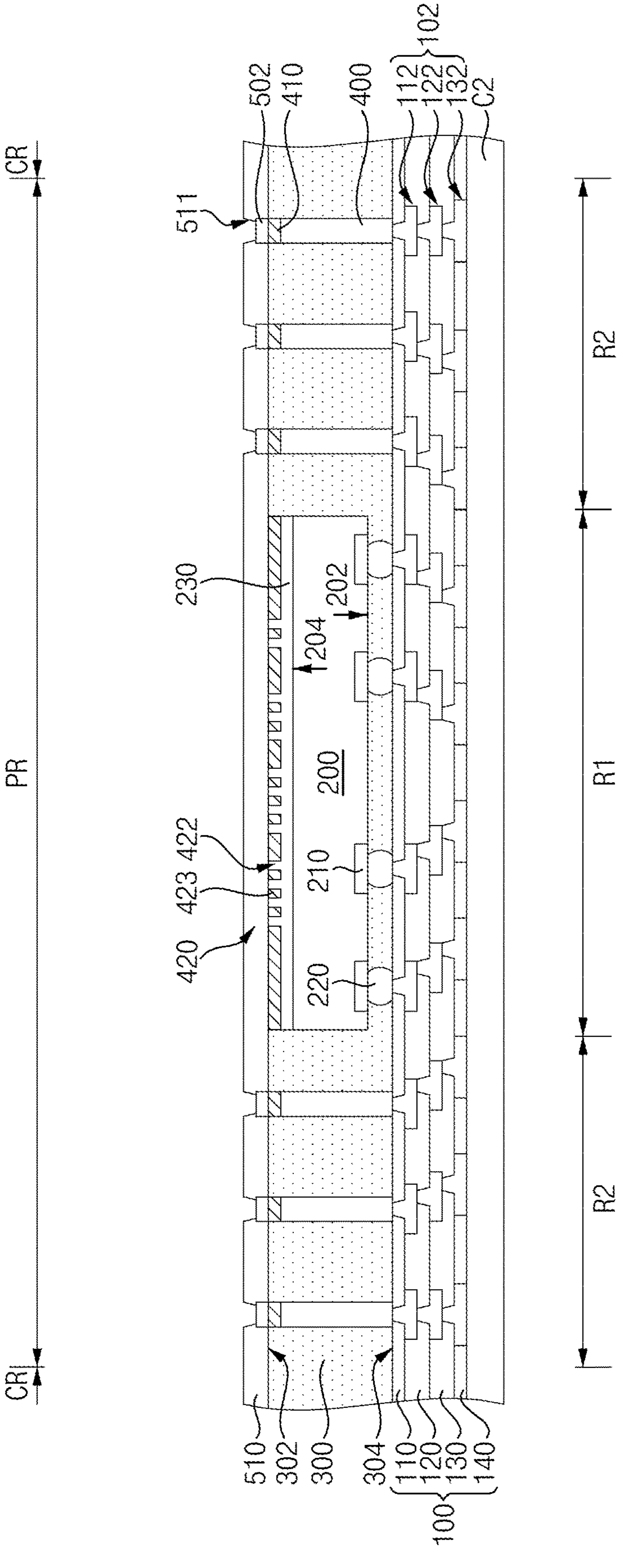

As illustrated in FIG. 19, after an upper redistribution wiring layer 510 as an upper insulating layer is formed on the first surface 302 of the sealing member 300, the upper redistribution wiring layer 510 may be patterned to form openings 511 that expose the second redistribution wirings 502 respectively. Accordingly, the upper redistribution wiring layer 510 having the second redistribution wirings 502 stacked in one level may be formed on the first surface 302 of the sealing member 300. The second redistribution wirings 502 may correspond to uppermost redistribution wirings, and may serve as bonding pads on which solder bumps for electrical connection with a second package are disposed.

Alternatively, the upper redistribution wiring layer may include first upper redistribution wirings and second upper redistribution wirings stacked in at least two levels. In this case, the upper redistribution wiring layer may includes a plurality of stacked upper insulating layers, the first upper redistribution wirings may correspond to the second redistribution wirings 502, and the second upper redistribution wirings may serve as bonding pads on which solder bumps for electrical connection with a second package are disposed.

Then, the second carrier substrate C2 may be removed, and external connection members 550 (see FIG. 1) may be formed on the package pads on a lower surface, that is, an outer surface of the lower redistribution wiring layer 100.

Then, the lower redistribution wiring layer 100 may be individualized or singulated through a sawing process to complete the fan-out wafer level package 10 of FIG. 1 including the sealing member 300, the lower redistribution wiring layer 100 formed on the lower surface 304 of the sealing member 300 and the upper redistribution wiring layer 510 formed on the upper surface 302 the sealing member 300.

Figure 20:
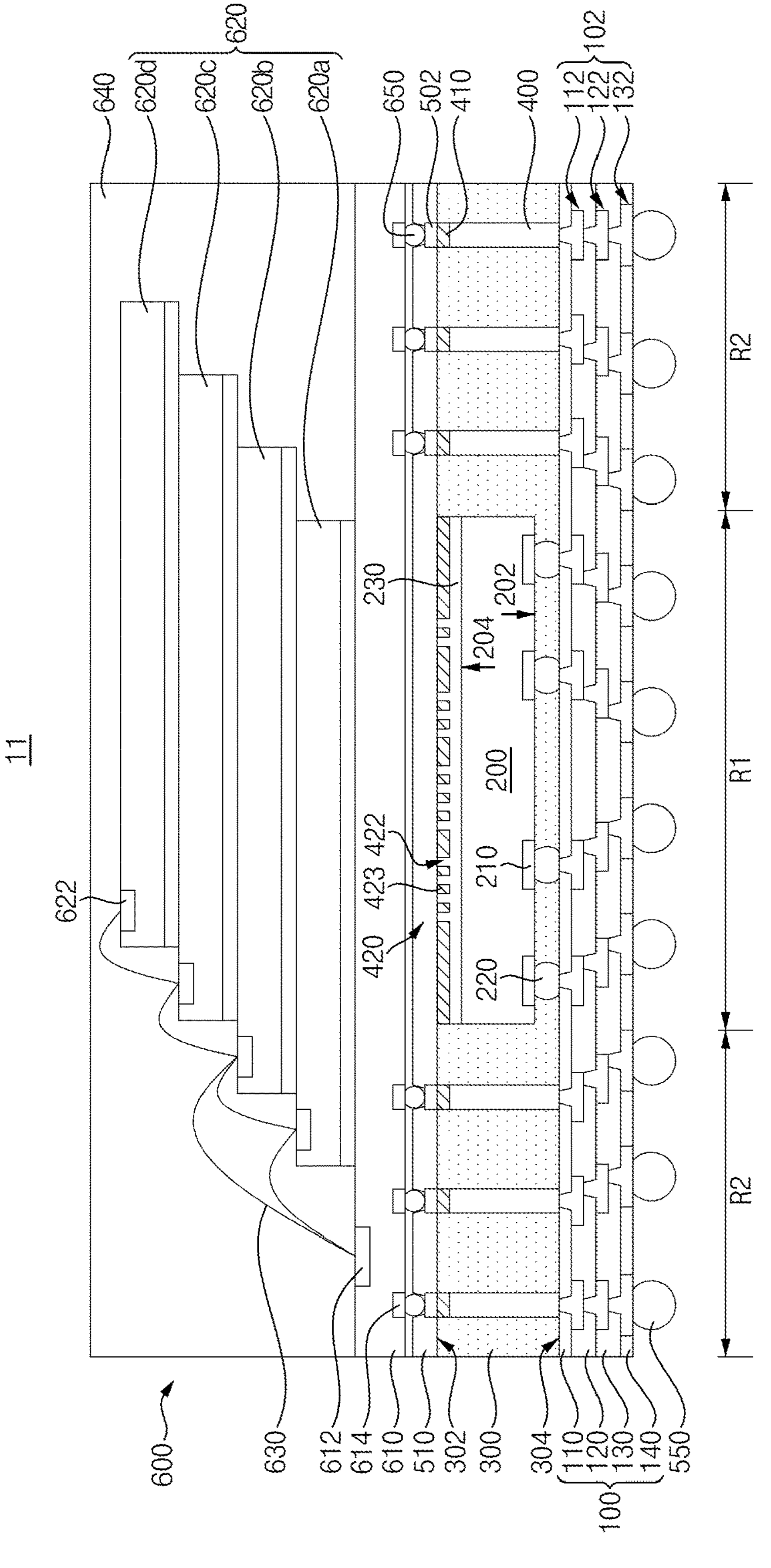

FIG. 20 is a cross-sectional view illustrating a semiconductor package in accordance with example embodiments. The semiconductor package may be substantially the same as the semiconductor package described with reference to FIG. 1 except for an additional second package. Thus, same reference numerals may be used to refer to same or like element, and any further repetitive explanation concerning the above elements will be omitted.

Referring to FIG. 20, a semiconductor package 11 may include a first package and a second package 600 stacked on the first package. The first package may include a lower redistribution wiring layer 100, a semiconductor chip 200, a sealing member 300 and an upper redistribution wiring layer 510. The first package may be substantially the same as or similar to the unit package 10 described with reference to FIG. 1.

In example embodiments, the second package 600 may include a second package substrate 610, a plurality of second semiconductor chips 620 mounted on the second package substrate 610, and a sealing member 640 on the second package substrate 610 covering the second semiconductor chips 620.

The second package 600 may be stacked on the first package via conductive connection members 650. For example, the conductive connection members 650 may include solder balls, conductive bumps, etc. The conductive connection member 650 may be disposed between a second redistribution wiring 502 of the upper redistribution wiring layer 510 and a second connection pad 614 of the second package substrate 610. Accordingly, the first package and the second package 600 may be electrically connected to each other by the conductive connection members 650.

A plurality of second semiconductor chips 620*a*, 620*b*, 620*c* and 620*d* may be sequentially stacked on the second package substrate 610 by adhesive members. Bonding wires 630 may connect second chip pads 622 of the second semiconductor chips 620 to first connection pads 612 of the second package substrate 610. The second semiconductor chips 620 may be electrically connected to the second package substrate 610 through the bonding wires 630.

Although the second package 600 is illustrated as including four semiconductor chips mounted by a wire bonding method, it will be understood that the number of the semiconductor chips in the second package and/or the mounting or bonding methods are not limited thereto.

In example embodiments, the semiconductor package 11 may further include a heat sink (not illustrated) stacked on the second package 600. The heat sink may be provided on the second package 600 to dissipate heat from the first and second packages to the outside. The heat sink may be attached on the second package 600 by using a thermal interface material (TIM).

Figure 21:
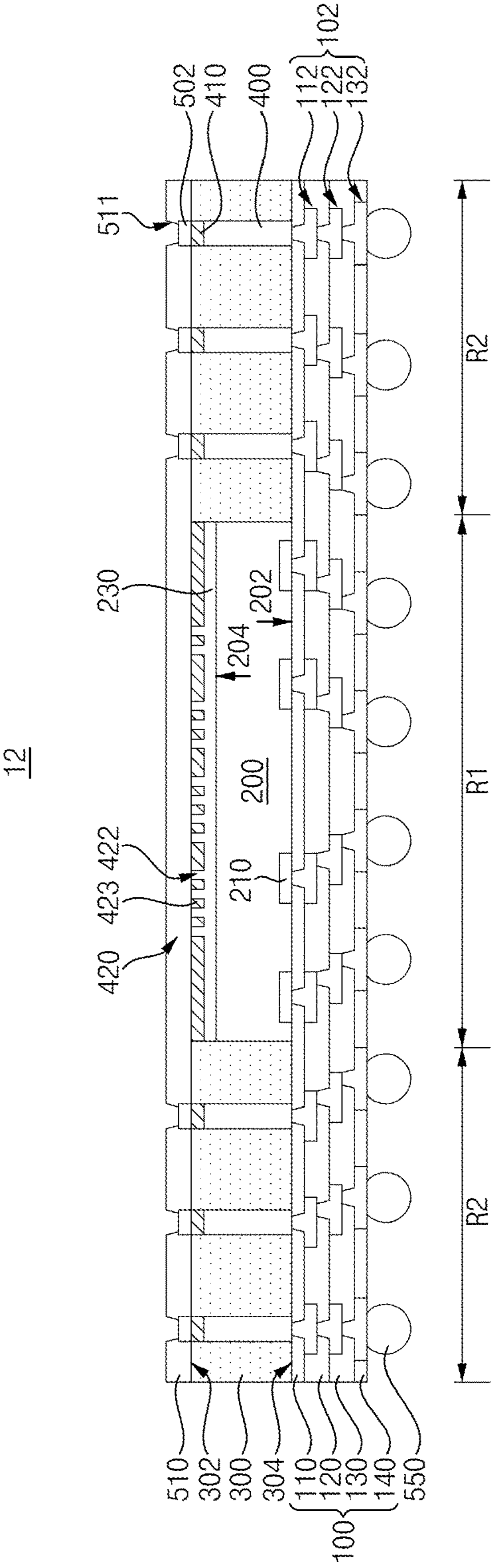

FIG. 21 is a cross-sectional view illustrating a semiconductor package in accordance with example embodiments. The semiconductor package may be substantially the same as the semiconductor package 10 described with reference to FIG. 1 except for a connection relationship between a semiconductor chip and a lower redistribution wiring layer. Thus, same reference numerals may be used to refer to same or like elements, and any further repetitive explanation concerning the above elements will be omitted.

Referring to FIG. 21, a semiconductor package 12 may include a lower redistribution wiring layer 100, a semiconductor chip 200 disposed on the lower redistribution wiring layer 100, a sealing member 300 on the lower redistribution wiring layer 100 covering at least a side surface of the semiconductor chips 200, a plurality of vertical conductive structures 400 penetrating the sealing member 300, a marking pattern 420 on the semiconductor chip 200, and an upper redistribution wiring layer 510 disposed on the sealing member 300. In addition, the semiconductor package 12 may further include external connection members 550 disposed on an outer surface of the lower redistribution wiring layer 300.

In example embodiments, the semiconductor chip 200 may have a plurality of chip pads 210 on a first surface 202, that is, an active surface. The semiconductor chip 200 may be accommodated in the sealing member 300 such that the first surface 202 on which the chip pads 210 are formed faces the lower redistribution wiring layer 100. The sealing member 300 may extend on or cover a side surface of the semiconductor chip 200. The first surface 202 of the semiconductor chip 200 may be exposed by the sealing member 300 from or at a second surface 304 of the sealing member 300, and a second surface 204 opposite to the first surface 202 of the semiconductor chip 200 may be exposed by the sealing member 300 from or at a first surface 302 of the sealing member 300.

In example embodiments, the lower redistribution wiring layer 100 may be disposed on the second surface 304 of the sealing member 300 and the first surface 202 of the semiconductor chip 200. The lower redistribution wiring layer 100 may include a plurality of first redistribution wirings 102. The first redistribution wirings 102 may be electrically connected to the chip pads 210 of the semiconductor chip 200 and the vertical conductive structures 400 respectively. The first redistribution wirings 102 may be provided on the front surface 202 of the semiconductor chip 200 and the second surface 304 of the sealing member 300 to serve as front redistribution wirings. Accordingly, the lower redistribution wiring layer 100 may be a front redistribution wiring layer of a fan-out package.

Hereinafter, a method of manufacturing the semiconductor package of FIG. 21 will be described.

FIGS. 22 to 26 are cross-sectional views illustrating a method of manufacturing a semiconductor package in accordance with example embodiments.

Figure 22:
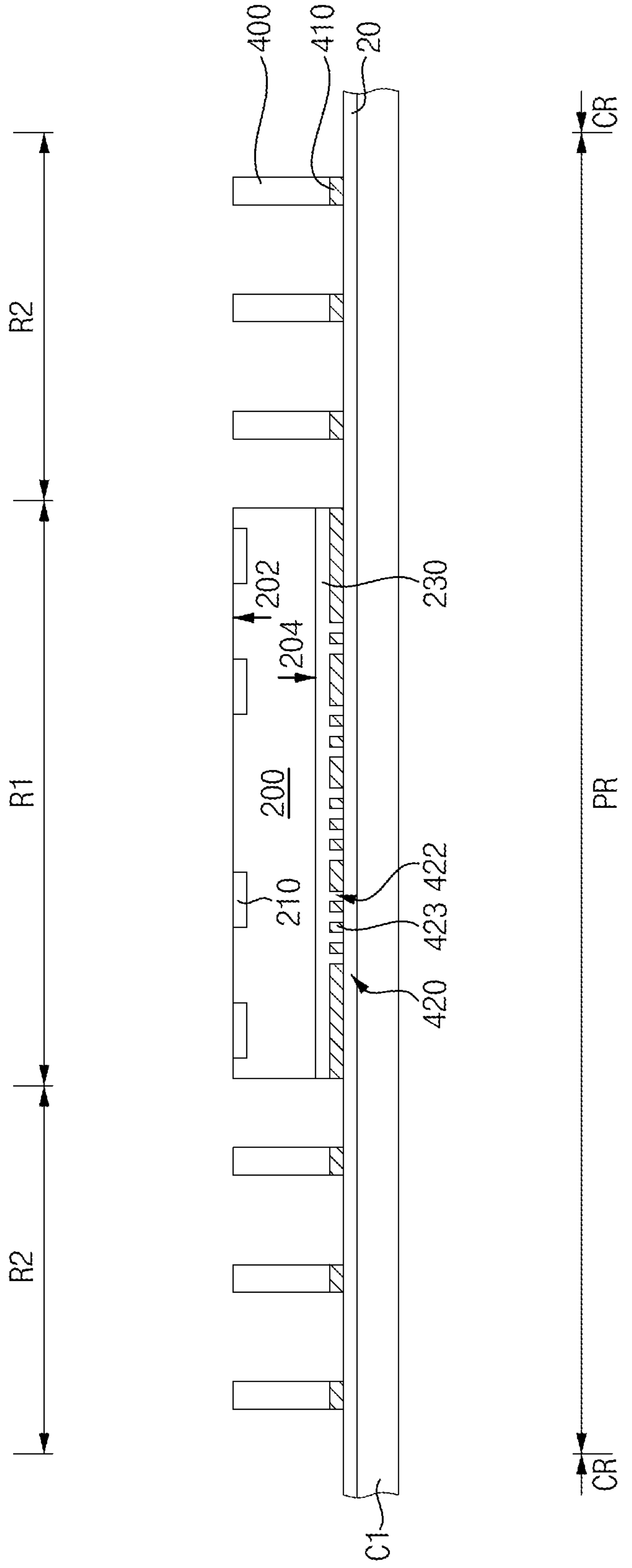

Referring to FIG. 22, first, processes the same as or similar to the processes described with reference to FIGS. 4 to 12 may be performed to form vertical conductive structures 400 and a marking pattern 420 on a first carrier substrate C1 and to dispose at least one semiconductor chip 200 on the first carrier substrate C1.

In example embodiments, the semiconductor chip 200 may be disposed in a fan-in region R1 of the first carrier substrate C1. The vertical conductive structures 400 may be disposed in a second region R2 around the semiconductor chip 200. The semiconductor chip 200 may be disposed such that a backside surface 204 opposite to a front surface 202 on which chip pads 210 are formed (that is, an active surface) faces the first carrier substrate C1.

Figure 23:
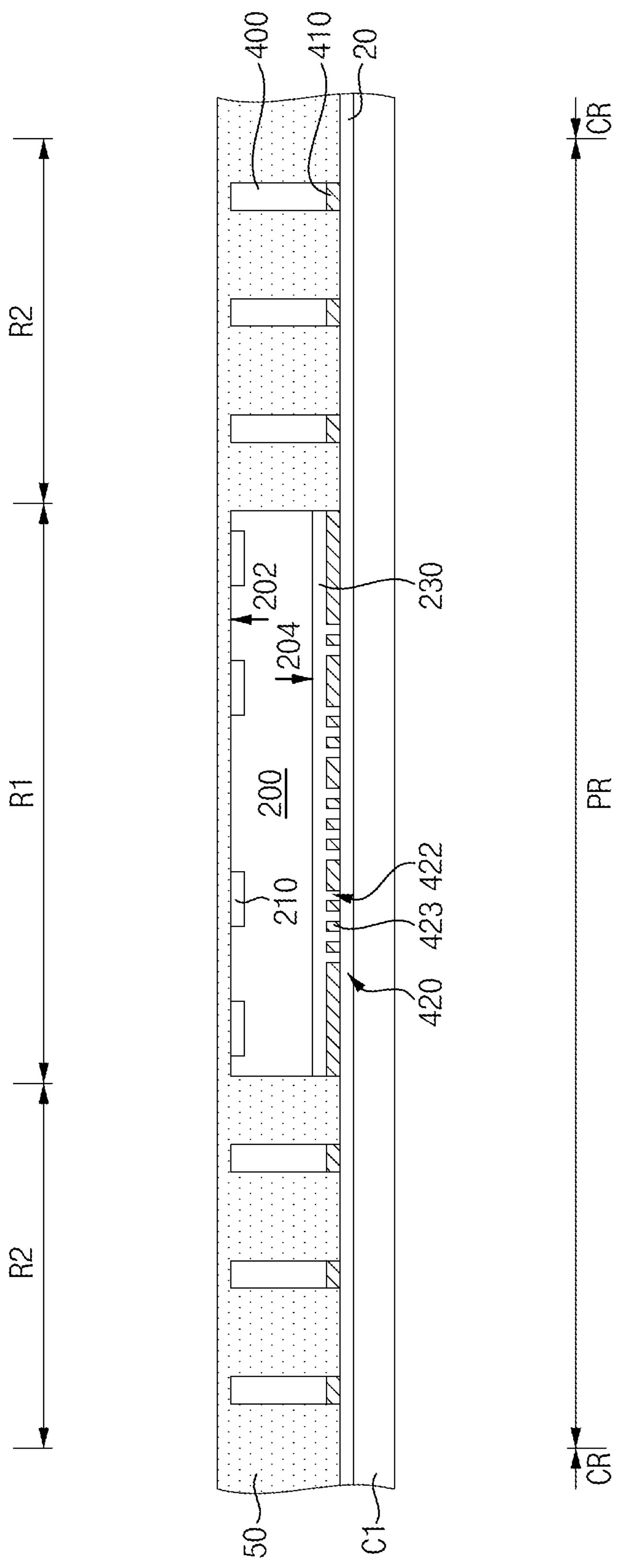
Figure 24:
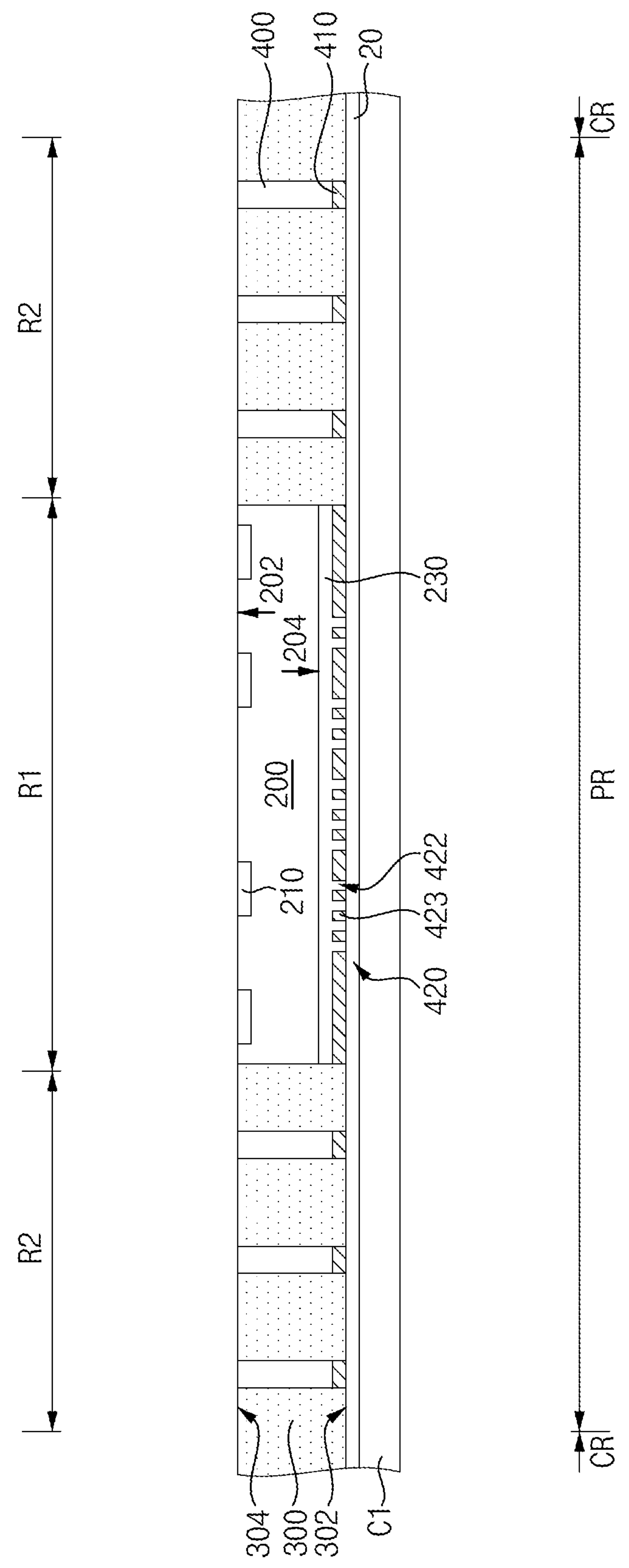

Referring to FIGS. 23 and 24, a sealing material 50 may be formed on the first carrier substrate C1 to cover the semiconductor chip 200 and the plurality of vertical conductive structures 400, and an upper portion of the sealing material 50 may be partially removed to form a sealing member 300 that exposes the front surface 202 of the semiconductor chip 200 and upper surfaces of the plurality of vertical conductive structures 400.

The sealing material 50 may be formed to cover the front surface 202 of the semiconductor chip 200 and the upper surfaces of the plurality of vertical conductive structures 400. For example, the sealing material 50 may include an epoxy molding compound (EMC).

The upper portion of the sealing material 50 may be partially removed by a grinding process. As the upper portion of the sealing material 50 is removed, the chip pads 210 on the front surface 202 of the semiconductor chip 200 and one end portions of the plurality of vertical conductive structures 410 may be exposed from a second surface 304 of the sealing member 300. The sealing member 300 may cover the side surface of the semiconductor chip 200.

Figure 25:
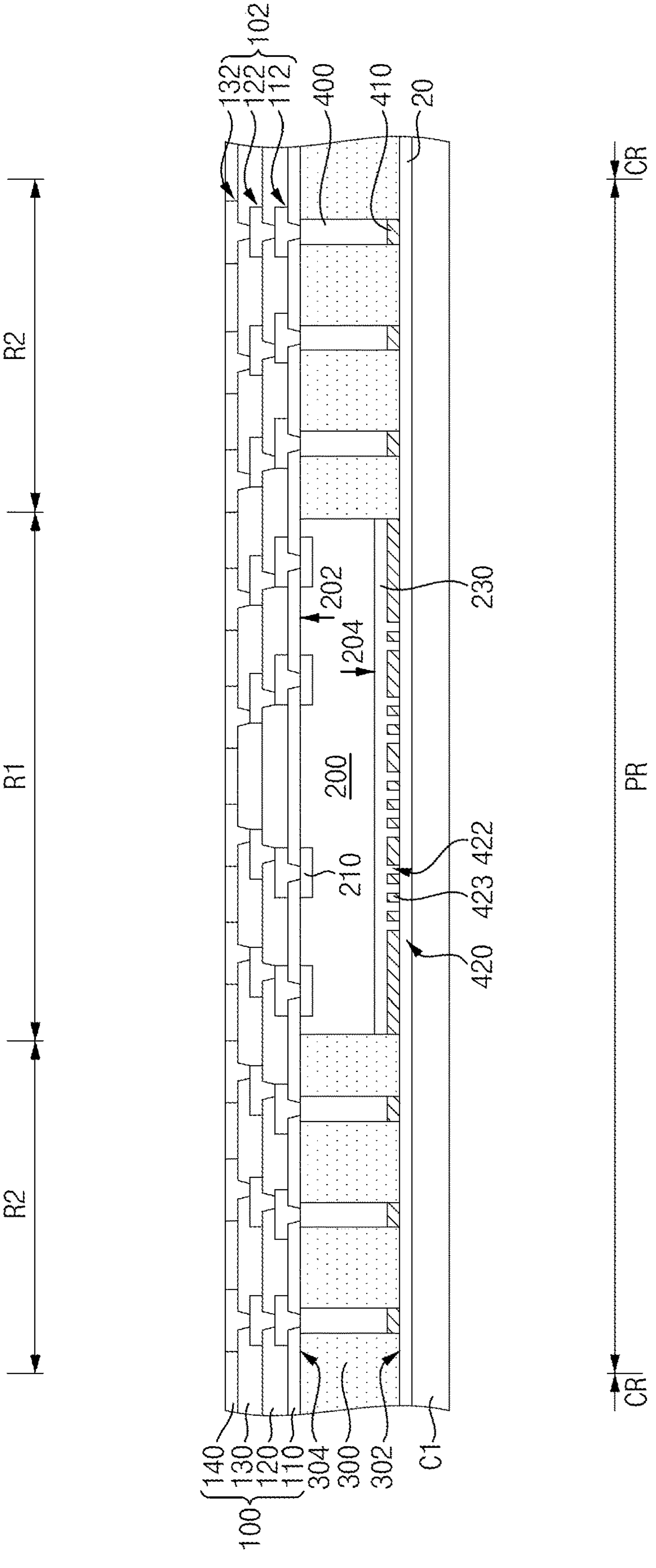

Referring to FIG. 25, processes the same as or similar to the processes described with reference to FIG. 15 may be performed to form a lower redistribution wiring layer 100 having first redistribution wirings 102 on the second surface 304 of the sealing member 300 and the front surface 202 of the semiconductor chip 200.

In example embodiments, after a first lower insulating layer 110 is formed on the second surface 304 of the sealing member 300, the first lower insulating layer 110 may be patterned to form openings that expose the chip pads 210 of the semiconductor chip 200 and the vertical conductive structures 400 respectively. Some of the openings of the patterned first lower insulating layer 110 may expose the vertical conductive structures 400 and others of the openings may expose the chip pads 210.

After a seed layer is formed on the vertical conductive structures 400 and the chip pads 210 and in the openings, the seed layer may be patterned and an electroplating process may be performed to form first lower redistribution wirings 112. Accordingly, at least portions of the first lower redistribution wirings 112 may directly contact the vertical conductive structures 400 and the chip pads 210 through the openings of the first lower insulating layer 110.

Similarly, after a second lower insulating layer 120 is formed on the first lower insulating layer 110, the second lower insulating layer 120 may be patterned to form openings that expose the first lower redistribution wirings 112. Then, second lower redistribution wirings 122 may be formed on the second lower insulating layer 120 to directly contact the first lower redistribution wirings 112 through the openings of the second lower insulating layer.

Then, after a third lower insulating layer 130 is formed on the second lower insulating layer 120, the third lower insulating layer 130 may be patterned to form openings that expose the second lower redistribution wirings 122. Then, third lower redistribution wirings 132 may be formed on the third lower insulating layer 130 to directly contact the second lower redistribution wirings 122 through the openings of the third lower insulating layer 130.

Then, package pads (not illustrated) may be formed on the third lower redistribution wirings 132, and a fourth lower insulating layer 140 may be formed on the third lower redistribution wiring layer 132 to expose at least portions of the package pads. The fourth lower insulating layer 140 may serve as a passivation layer.

Figure 26:
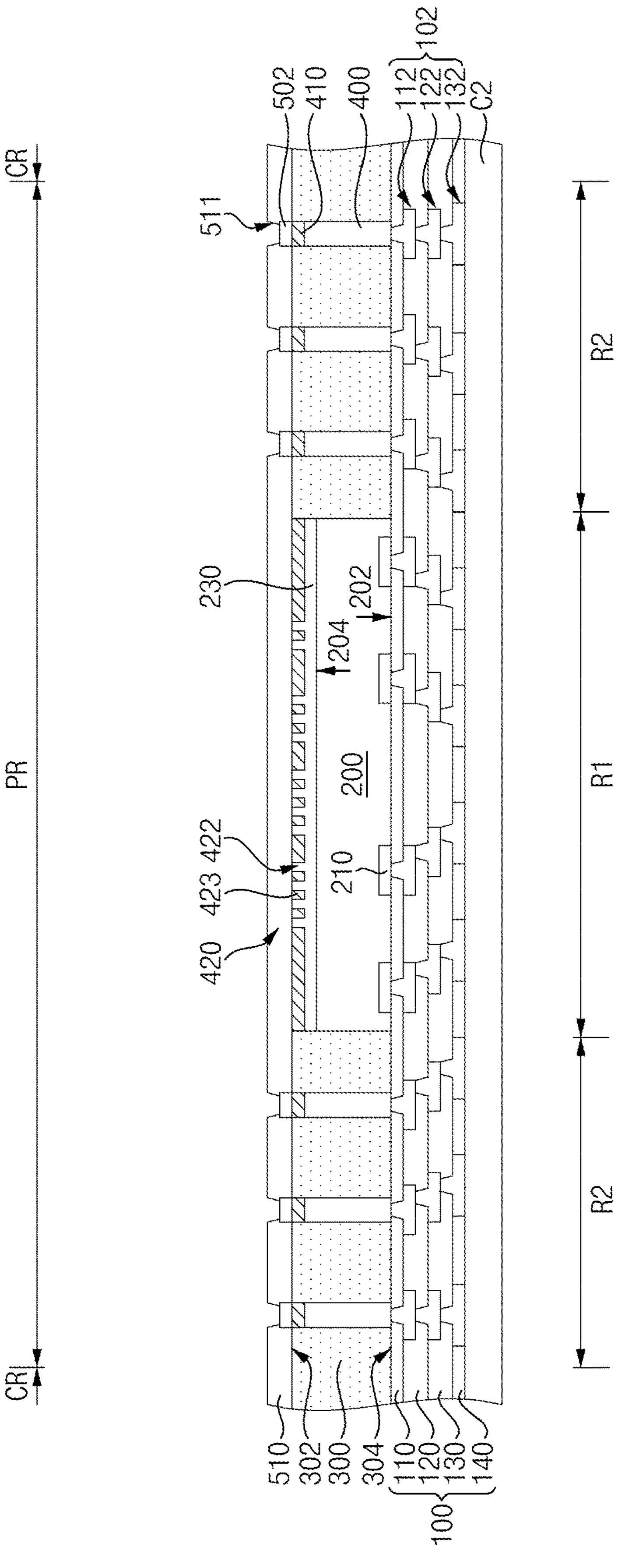

Referring to FIG. 26, processes the same as or similar to the processes described with reference to FIGS. 16 to 19 may be performed to form an upper redistribution wiring layer 510 having second redistribution wirings 502 electrically connected to the vertical conductive structures 400 on the upper surface 302 of the sealing member 300 and to form external connection members 550 on an outer surface of the lower redistribution wiring layer 100 to be electrically connected to the first redistribution wirings 102 respectively, complete the fan-out wafer level package 12 of FIG. 21.

The semiconductor packages described herein may include semiconductor devices such as logic devices or memory devices. The semiconductor packages may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

Spatially relative terms, such as "under," "below," "lower," "over," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" or "over" the other elements or features. Thus, the term "below" can encompass both an orientation of above and below. The device may be otherwise oriented (rotated 90 degrees or at other orientations), and the spatially relative descriptors used herein may be interpreted accordingly.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:

a lower redistribution wiring layer having a first region and a second region adjacent the first region, the lower redistribution wiring layer including first redistribution wirings;

a semiconductor chip on the first region of the lower redistribution wiring layer and electrically connected to the first redistribution wirings;

a sealing member on a side surface of the semiconductor chip on the lower redistribution wiring layer;

a plurality of vertical conductive structures penetrating the sealing member on the second region of the lower redistribution wiring layer and electrically connected to the first redistribution wirings;

a marking pattern in a marking layer of the semiconductor chip;

seed layer pads on respective end portions of the vertical conductive structures that are in the marking layer and exposed by the sealing member at an upper surface thereof; and an upper redistribution wiring layer including a layer of second redistribution wirings electrically connected to the plurality of vertical conductive structures, wherein the layer of second redistribution wiring is on the sealing member and the marking layer.

2. The semiconductor package of claim 1, wherein an upper surface of the marking pattern is coplanar with the upper surface of the sealing member.

3. The semiconductor package of claim 1, wherein an upper surface of the seed layer pad is coplanar with or lower than the upper surface of the sealing member.

4. The semiconductor package of claim 1, wherein the sealing member is on a side surface of the marking pattern.

5. The semiconductor package of claim 1, wherein the marking pattern includes a first seed layer and a second seed layer stacked on the first seed layer.

6. The semiconductor package of claim 5, wherein the first seed layer includes copper, and the second seed layer includes titanium.

7. The semiconductor package of claim 5, wherein the seed layer pads respectively comprise the first seed layer and the second seed layer stacked on the first seed layer, or wherein the seed layer pads respectively comprise the first seed layer.

8. The semiconductor package of claim 1, wherein the marking pattern has a thickness of about 0.1 micrometers (μm) to about 0.5 μm.

9. The semiconductor package of claim 1, wherein the marking pattern is attached on a backside of the semiconductor chip by an adhesive film, wherein the backside of the semiconductor chip is opposite the lower redistribution wiring layer.

10. The semiconductor package of claim 1, wherein the semiconductor chip is a first semiconductor chip of a first package, and further comprising:

a second package on the upper redistribution wiring layer, wherein the second package includes a package substrate and at least one second semiconductor chip stacked on the package substrate.

11. A semiconductor package, comprising:

a lower redistribution wiring layer including first redistribution wirings;

a semiconductor chip on the lower redistribution wiring layer, wherein a first surface of the semiconductor chip comprising chip pads faces the lower redistribution wiring layer;

a sealing member on the semiconductor chip and on the lower redistribution wiring layer, wherein the sealing member exposes a second surface of the semiconductor chip opposite to the first surface;

a plurality of vertical conductive structures penetrating the sealing member and electrically connected to the first redistribution wirings;

a marking pattern in a marking layer on the second surface of the semiconductor chip; and an upper redistribution wiring layer including a layer of second redistribution wirings electrically connected to the plurality of vertical conductive structures, wherein the layer of second redistribution wiring is on the sealing member and the marking layer, wherein an upper surface of the marking pattern is coplanar with an upper surface of the sealing member.

12. The semiconductor package of claim 11, further comprising:

seed layer pads on respective end portions of the vertical conductive structures that are exposed by the sealing member at the upper surface thereof.

13. The semiconductor package of claim 12, wherein upper surfaces of the seed layer pads are coplanar with or lower than the upper surface of the sealing member.

14. The semiconductor package of claim 12, wherein the sealing member is on side surfaces of the seed layer pads.

15. The semiconductor package of claim 12, wherein:

the seed layer pads respectively comprise a first seed layer and a second seed layer stacked on the first seed layer, or the seed layer pads respectively comprise the first seed layer; and wherein the marking pattern comprises the first seed layer and the second seed layer.

16. A semiconductor package, comprising:

a lower redistribution wiring layer having a first region and a second region adjacent the first region, the lower redistribution wiring layer including first redistribution wirings;

a semiconductor chip on the first region of the lower redistribution wiring layer, wherein a first surface of the semiconductor chip comprising chip pads faces the lower redistribution wiring layer;

a sealing member on the semiconductor chip and on the lower redistribution wiring layer, wherein the sealing member exposes a second surface of the semiconductor chip opposite to the first surface;

a plurality of vertical conductive structures penetrating the sealing member on the second region of the lower redistribution wiring layer and electrically connected to the first redistribution wirings;

a marking pattern on the second surface of the semiconductor chip;

seed layer pads on respective end portions of the vertical conductive structures that are exposed by the sealing member at an upper surface thereof; and an upper redistribution wiring layer on the sealing member and the marking pattern, the upper redistribution wiring layer including second redistribution wirings on the seed layer pads, wherein the sealing member is on a side surface of the marking pattern and is on side surfaces of the seed layer pads.

17. The semiconductor package of claim 16, wherein the marking pattern includes a first seed layer and a second seed layer stacked on the first seed layer.

18. The semiconductor package of claim 16, wherein the marking pattern includes a seed layer dummy pattern on the second surface of the semiconductor chip and a plurality of openings penetrating the seed layer dummy pattern to define an intaglio pattern.

19. The semiconductor package of claim 16, wherein the marking pattern is attached to the second surface of the semiconductor chip by an adhesive film.

20. The semiconductor package of claim 19, wherein the adhesive film at least partially fills a plurality of openings that extend through the marking pattern.

* * * * *